United States Patent
Xie et al.

(10) Patent No.: US 12,489,035 B2
(45) Date of Patent: Dec. 2, 2025

(54) SEMICONDUCTOR PASSIVE DEVICE INTEGRATION FOR SILICON-ON-INSULATOR SUBSTRATE

(71) Applicant: International Business Machines Corporation, Armonk, NY (US)

(72) Inventors: Ruilong Xie, Niskayuna, NY (US); Kisik Choi, Watervliet, NY (US); Tenko Yamashita, Schenectady, NY (US); John Christopher Arnold, North Chatham, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 389 days.

(21) Appl. No.: 18/324,778

(22) Filed: May 26, 2023

(65) Prior Publication Data

US 2024/0395664 A1 Nov. 28, 2024

(51) Int. Cl.
| | |
|---|---|
| H01L 23/48 | (2006.01) |
| H10D 30/01 | (2025.01) |
| H10D 30/62 | (2025.01) |
| H10D 64/01 | (2025.01) |
| H10D 84/01 | (2025.01) |
| H10D 84/03 | (2025.01) |
| H10D 84/85 | (2025.01) |

(52) U.S. Cl.
CPC ......... H01L 23/481 (2013.01); H10D 30/024 (2025.01); H10D 30/6211 (2025.01); H10D 30/6219 (2025.01); H10D 64/017 (2025.01); H10D 84/017 (2025.01); H10D 84/0186 (2025.01); H10D 84/0193 (2025.01); H10D 84/038 (2025.01); H10D 84/853 (2025.01)

(58) Field of Classification Search
None
See application file for complete search history.

(56) References Cited

U.S. PATENT DOCUMENTS

| | | |
|---|---|---|
| 7,122,421 B2 | 10/2006 | Sanchez |
| 7,193,239 B2 | 3/2007 | Leedy |
| 10,192,870 B2 | 1/2019 | Yamaji |
| 11,264,357 B1 | 3/2022 | Delacruz |
| 11,450,600 B2 | 9/2022 | Huang |
| 2021/0111115 A1* | 4/2021 | Morrow ............... H10D 62/393 |
| 2021/0134721 A1 | 5/2021 | Chiang |

(Continued)

*Primary Examiner* — Nduka E Ojeh
(74) *Attorney, Agent, or Firm* — David K. Mattheis

(57) ABSTRACT

A semiconductor structure includes logic device and passive device regions. The logic device region includes field effect transistors (FETs) having a gate structure and a source/drain region disposed on opposing sides of the gate structure. At least one source/drain region extends within a buried dielectric layer for electrically connecting a FET to a backside power rail (BPR). The passive device region includes passive devices disposed on a first side of a first semiconductor layer. A second semiconductor layer is disposed above a second side of the first semiconductor layer opposing the first side. A backside interlevel dielectric (BILD) is above the second semiconductor layer and the buried dielectric layer. The BPR is embedded within the BILD in the logic device region. A top surface of the BILD in the passive device region is coplanar with a top surface of the BPR and the BILD in the logic device region.

20 Claims, 17 Drawing Sheets

Section X
Logic Device Region

(56) References Cited

U.S. PATENT DOCUMENTS

| | | | |
|---|---|---|---|
| 2021/0202385 A1 | 7/2021 | Huang | |
| 2021/0305252 A1* | 9/2021 | Chiang | ............... H10D 30/024 |
| 2021/0305381 A1 | 9/2021 | Chiang | |
| 2021/0351303 A1 | 11/2021 | Ju | |
| 2021/0376071 A1 | 12/2021 | Liu | |
| 2021/0376093 A1 | 12/2021 | Chu | |
| 2022/0231157 A1 | 7/2022 | Wu | |
| 2023/0131382 A1* | 4/2023 | Ding | ...................... H01L 25/16 |
| | | | 257/211 |
| 2024/0332358 A1* | 10/2024 | Cha | ........................ H10D 30/43 |

\* cited by examiner

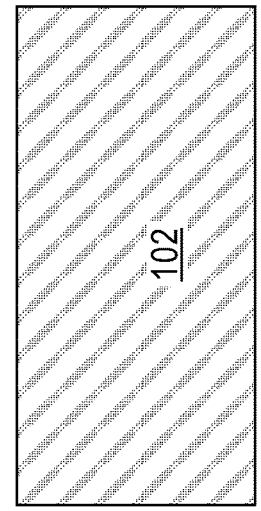
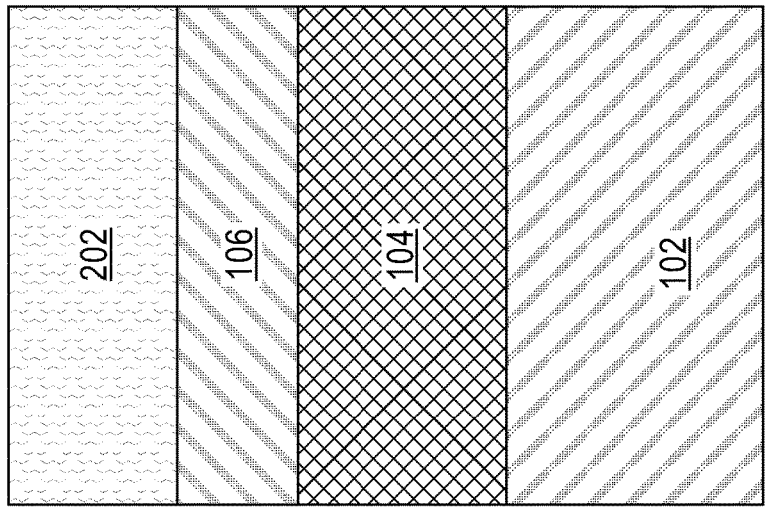
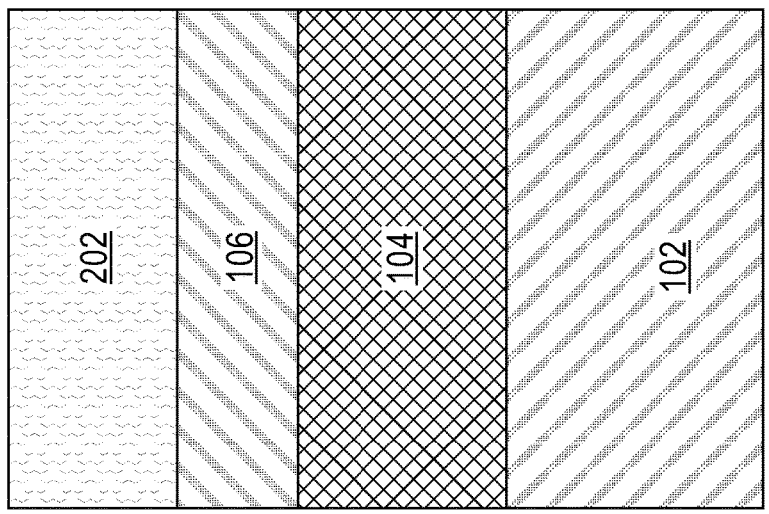

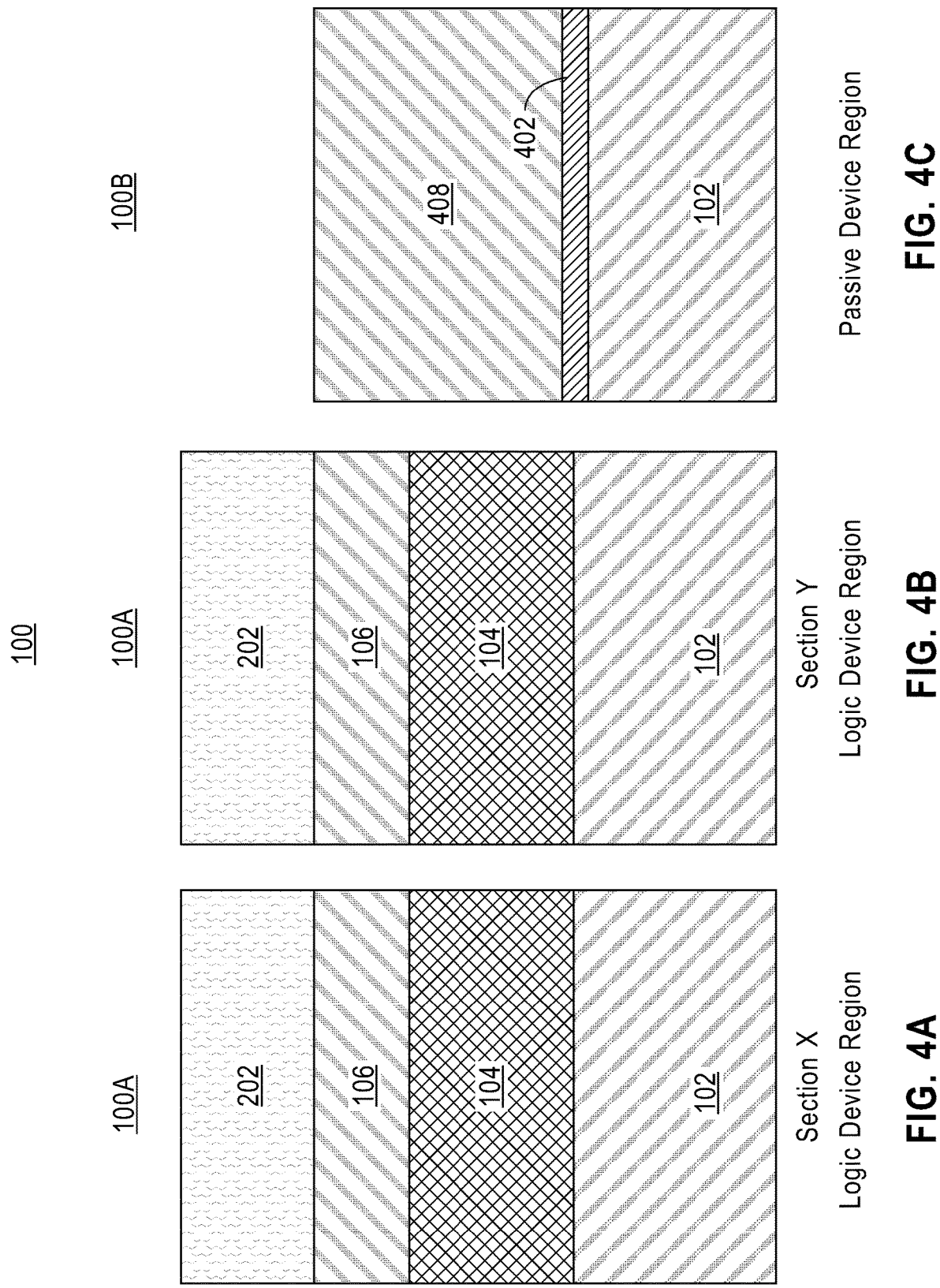

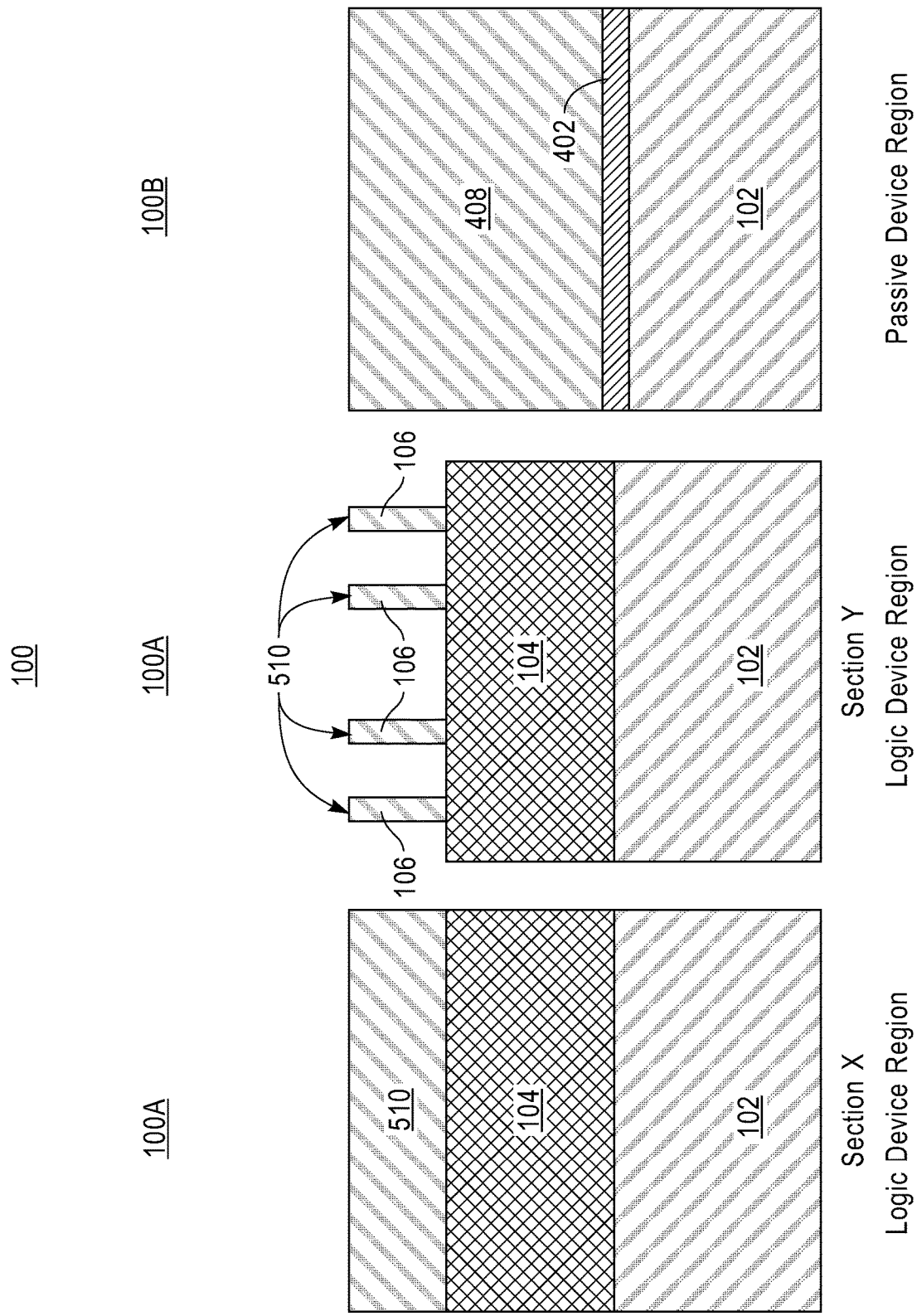

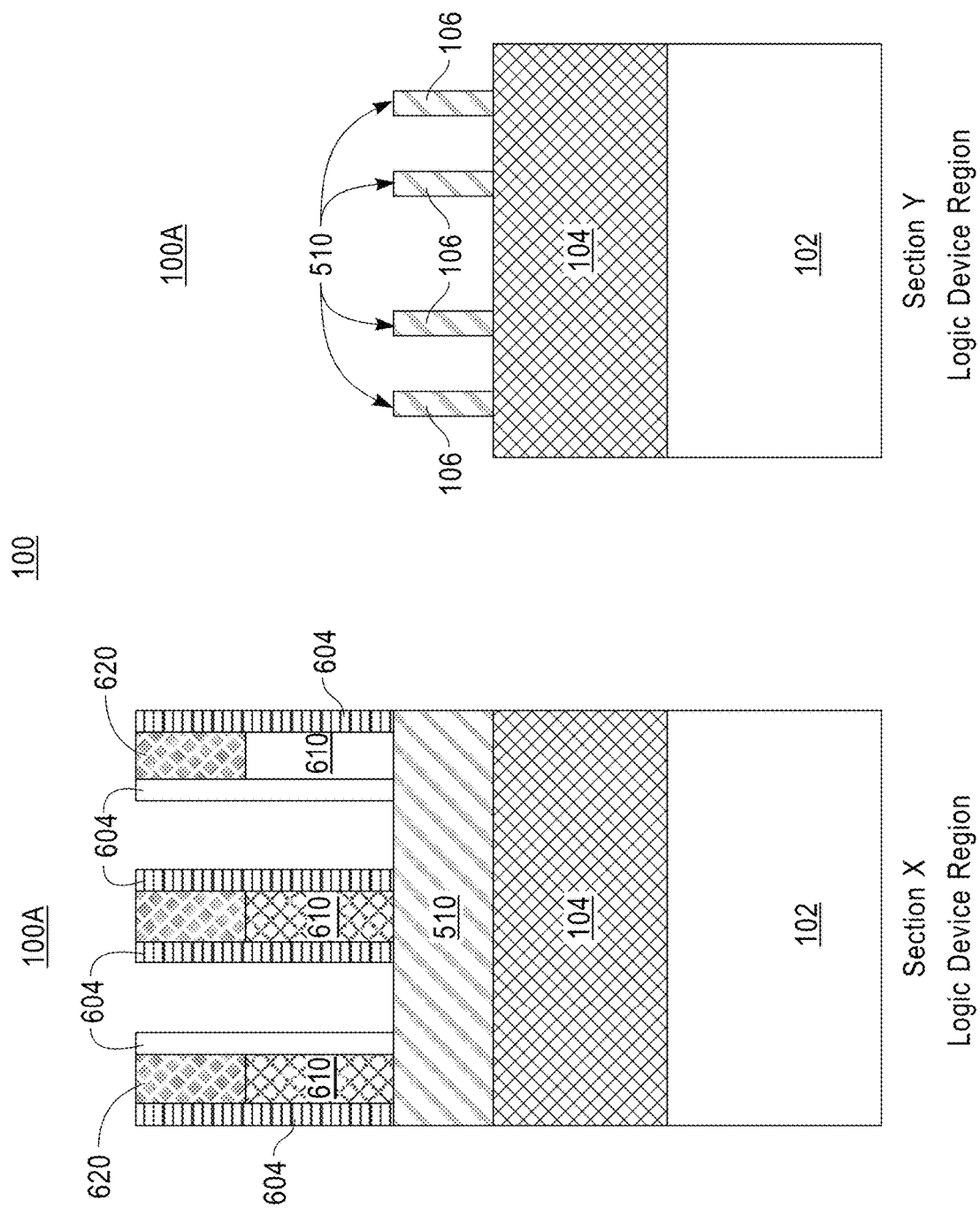

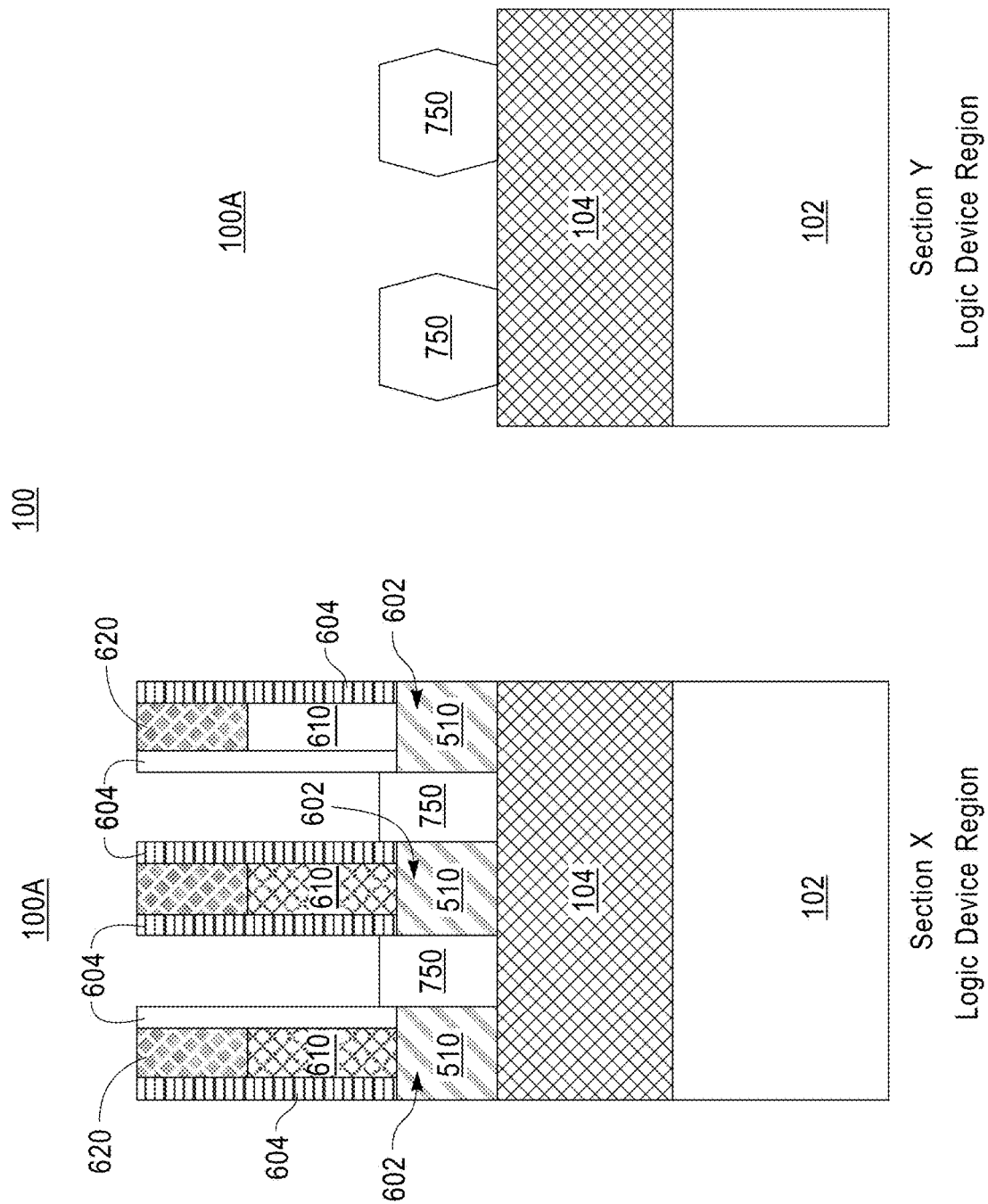

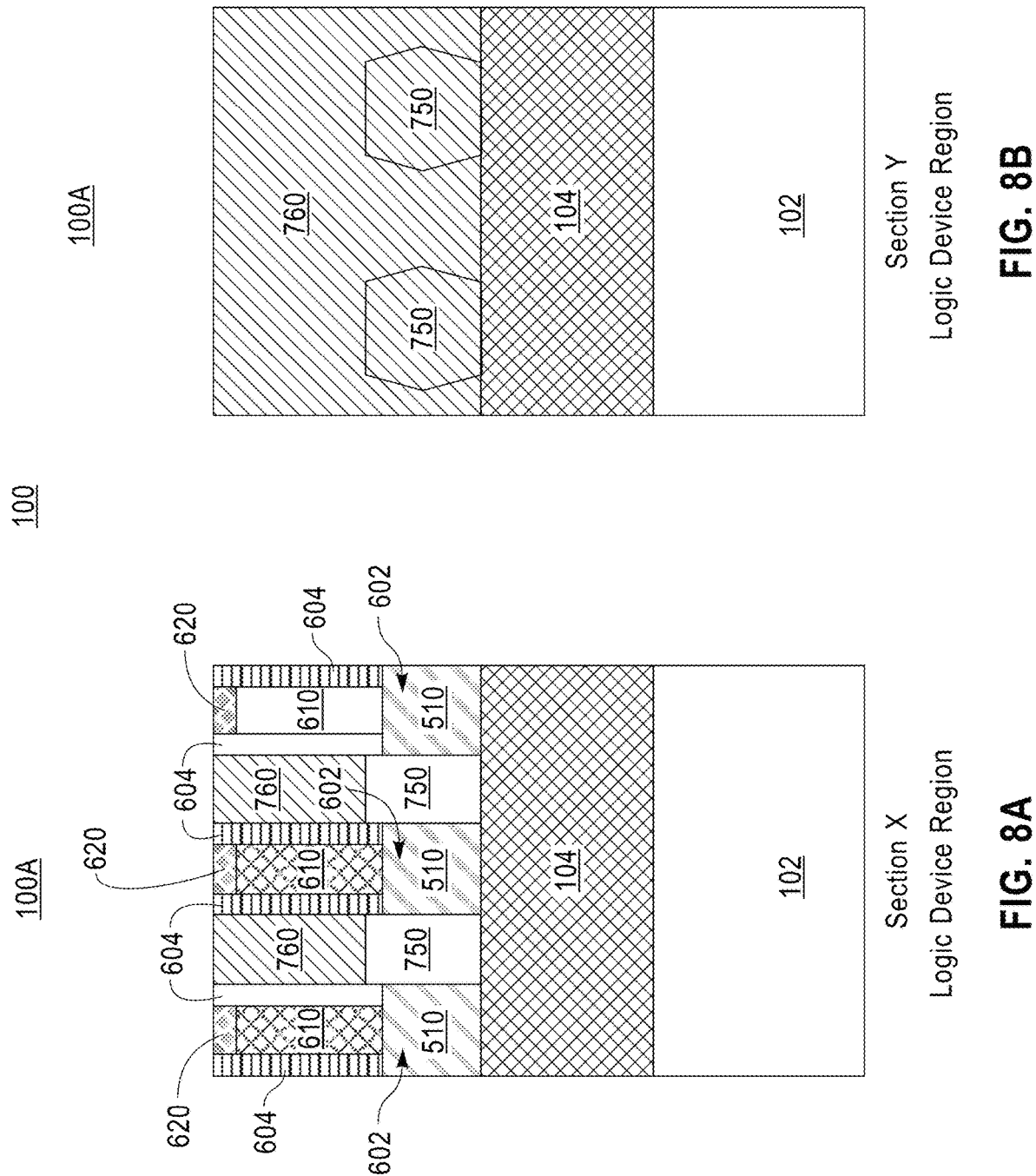

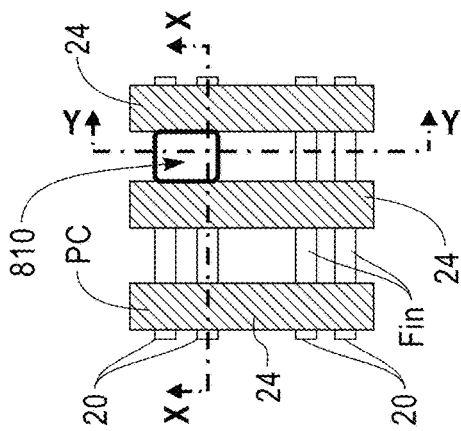
FIG. 9C
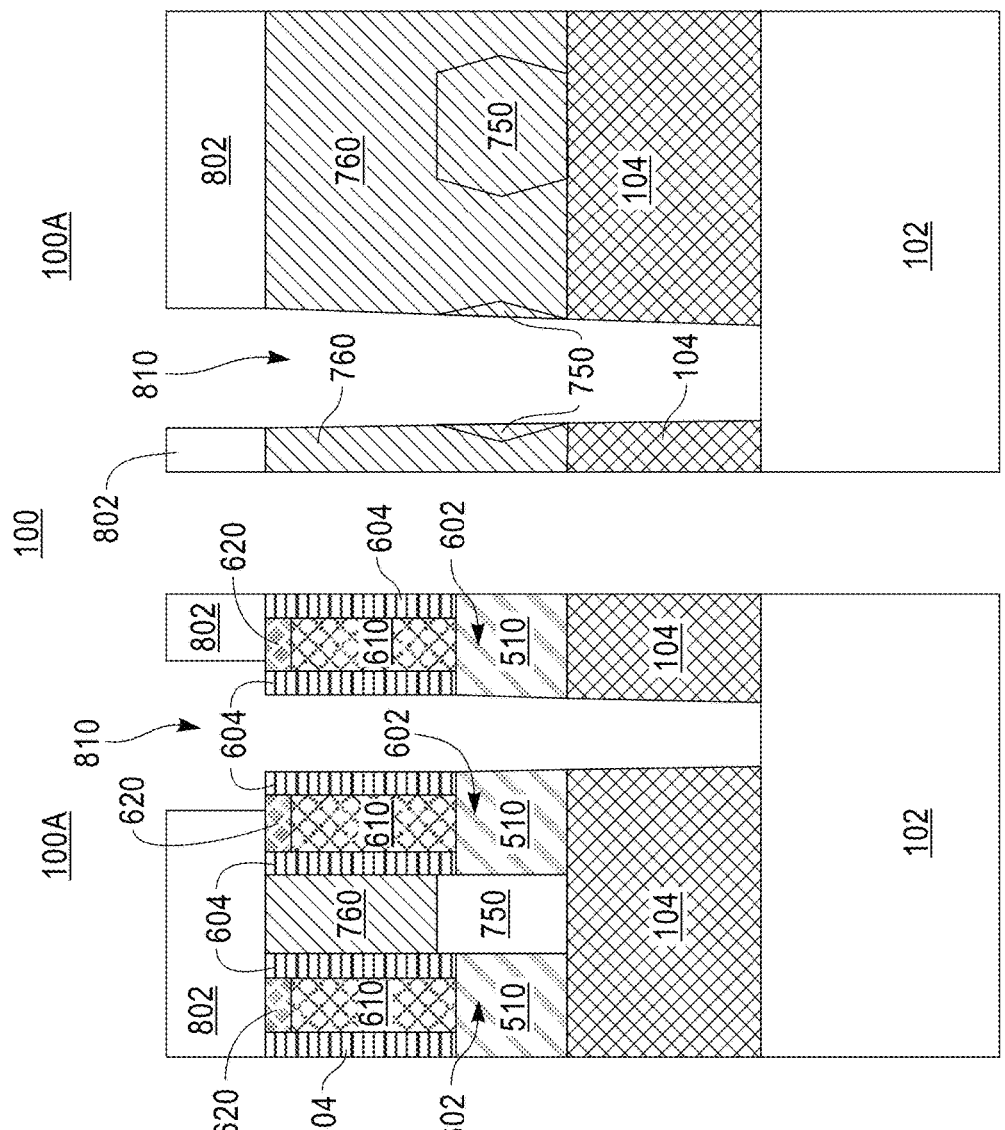
FIG. 9B
FIG. 9A

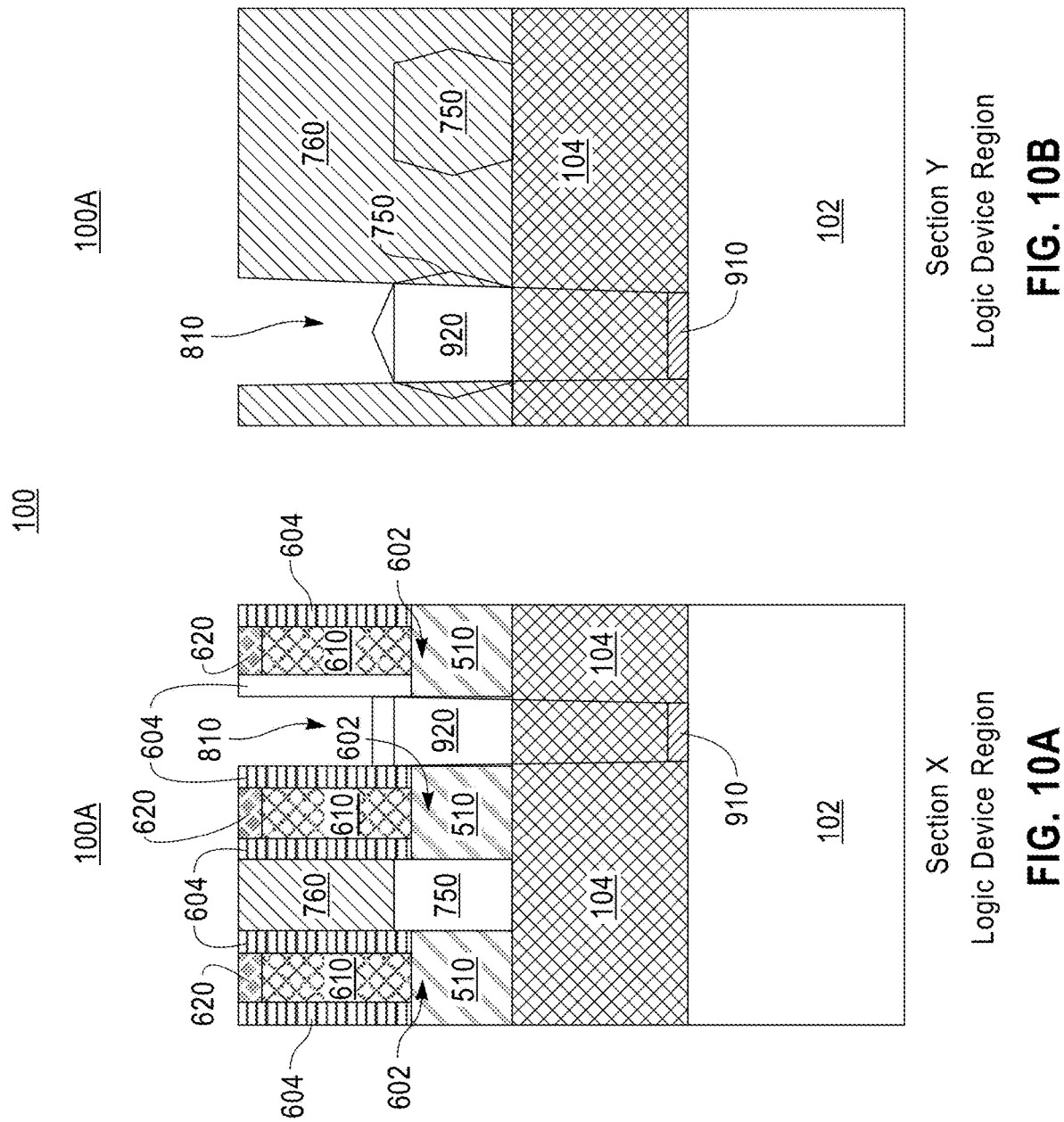

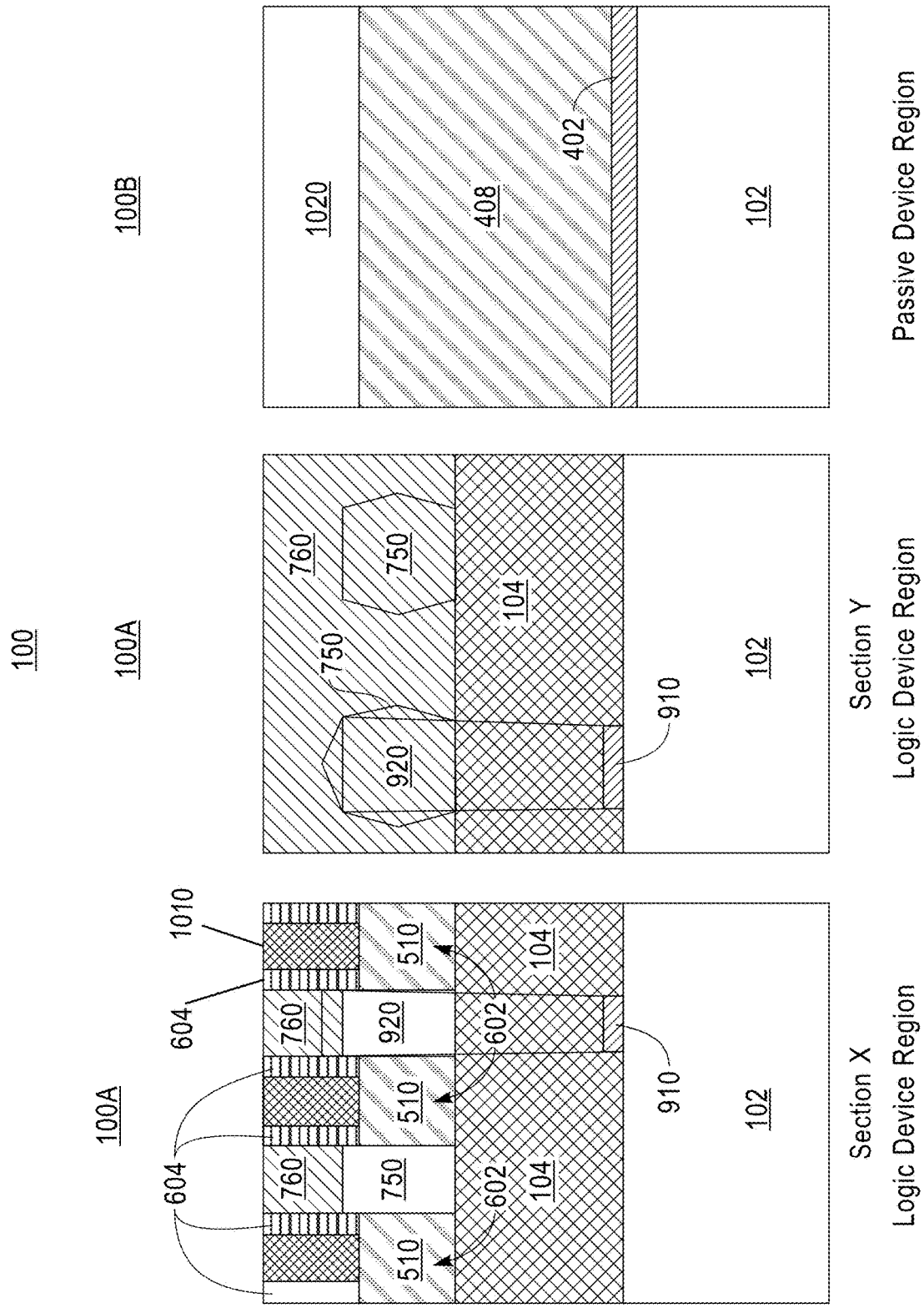

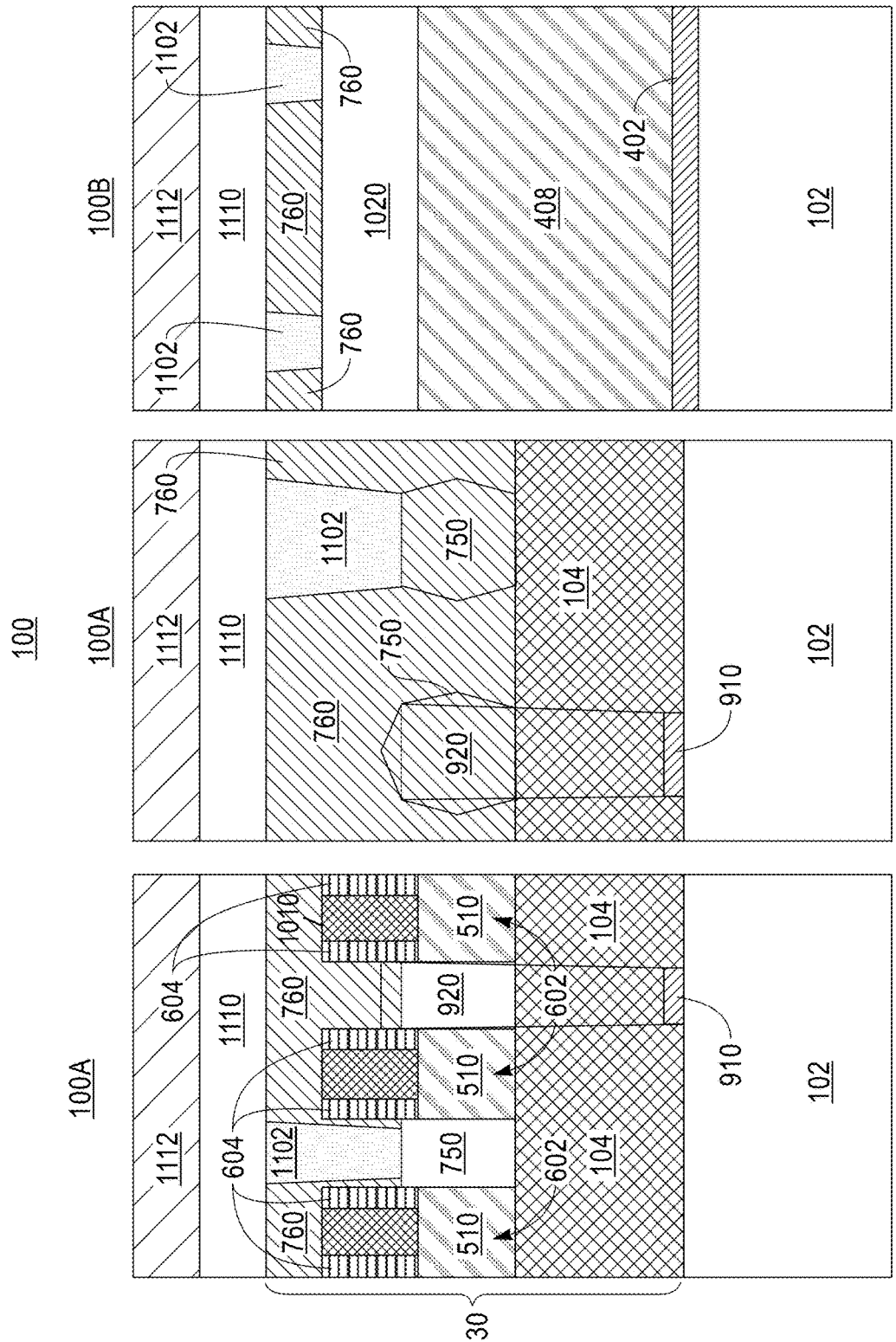

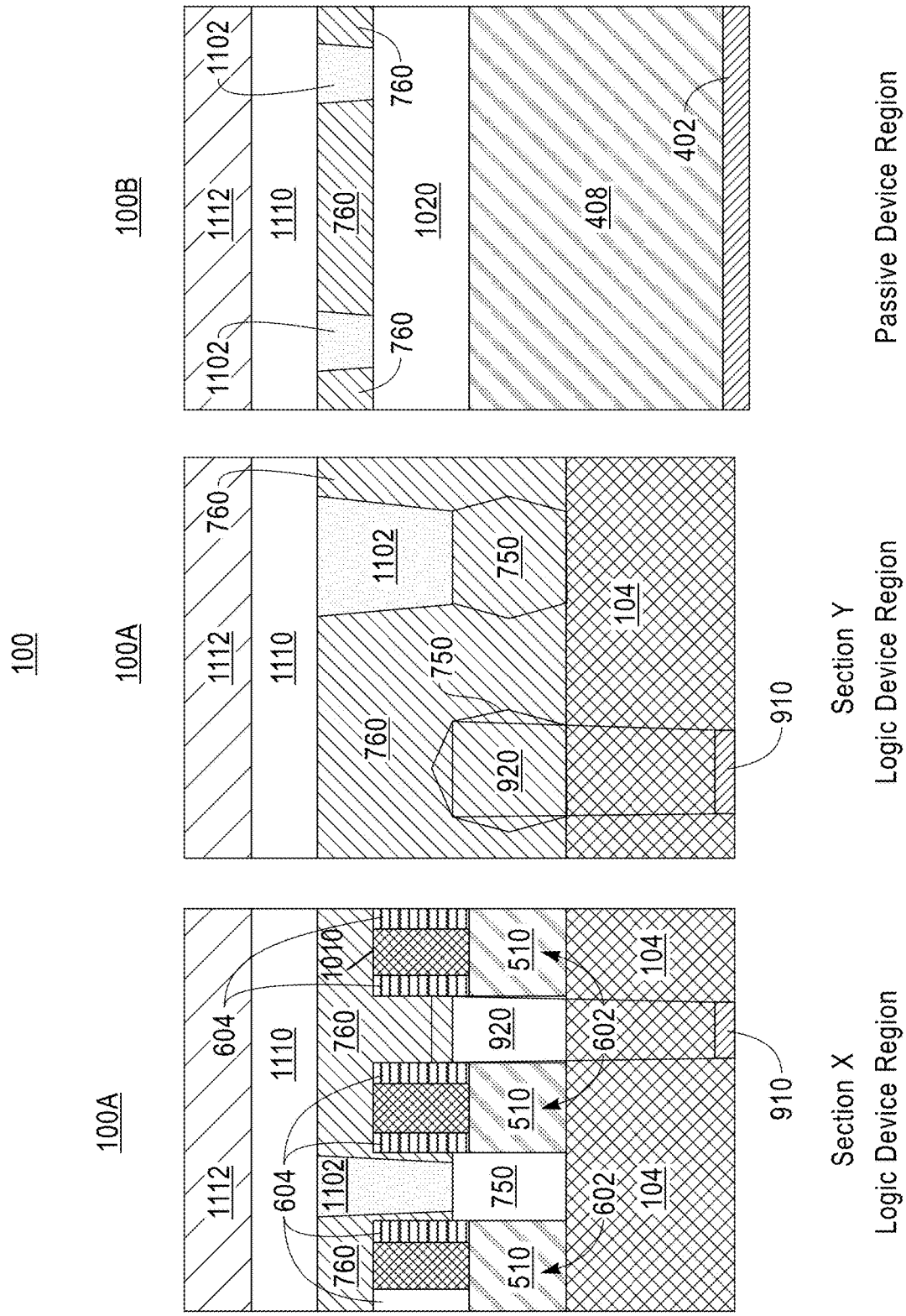
FIG. 13A — Section X, Logic Device Region
FIG. 13B — Section Y, Logic Device Region
FIG. 13C — Passive Device Region

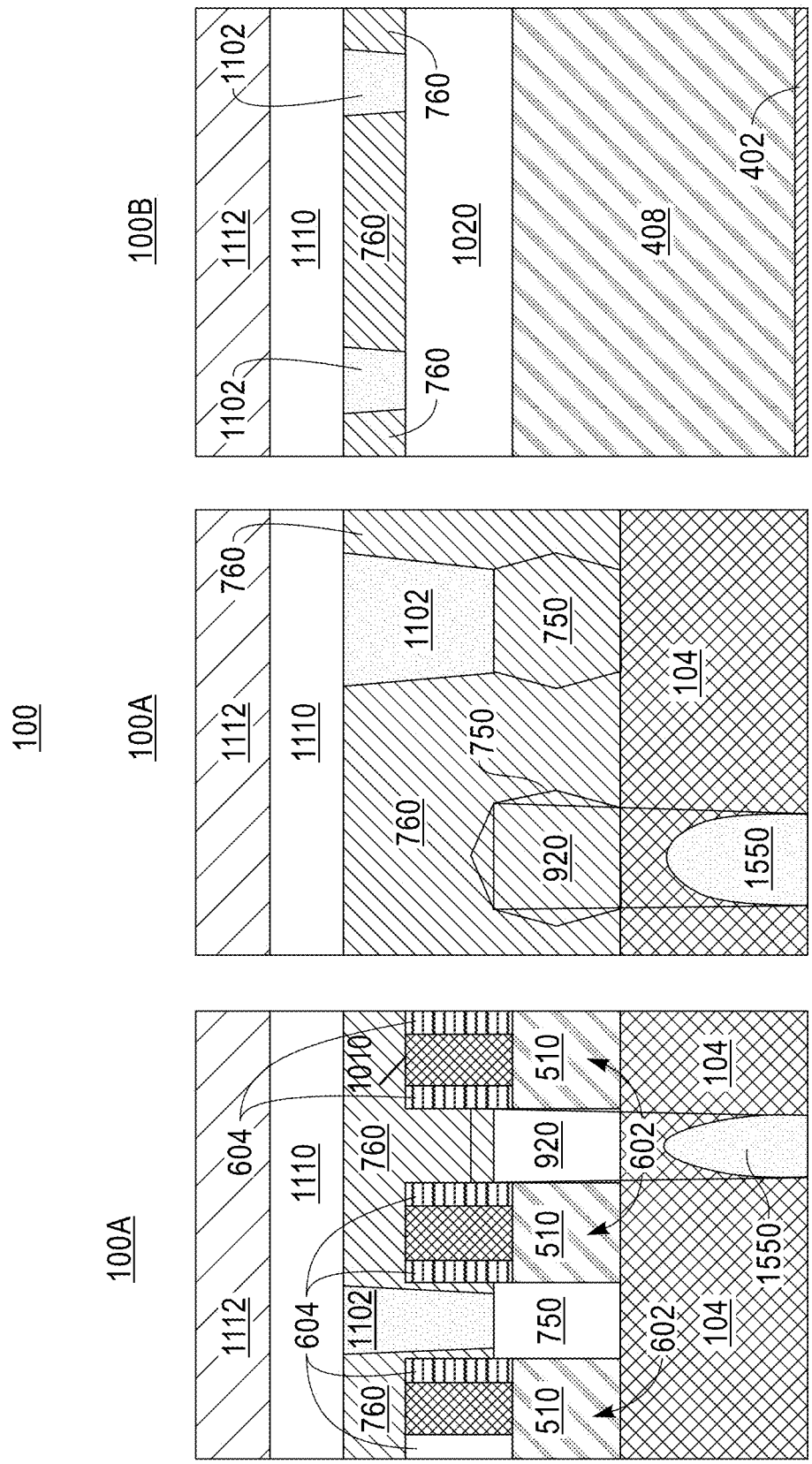

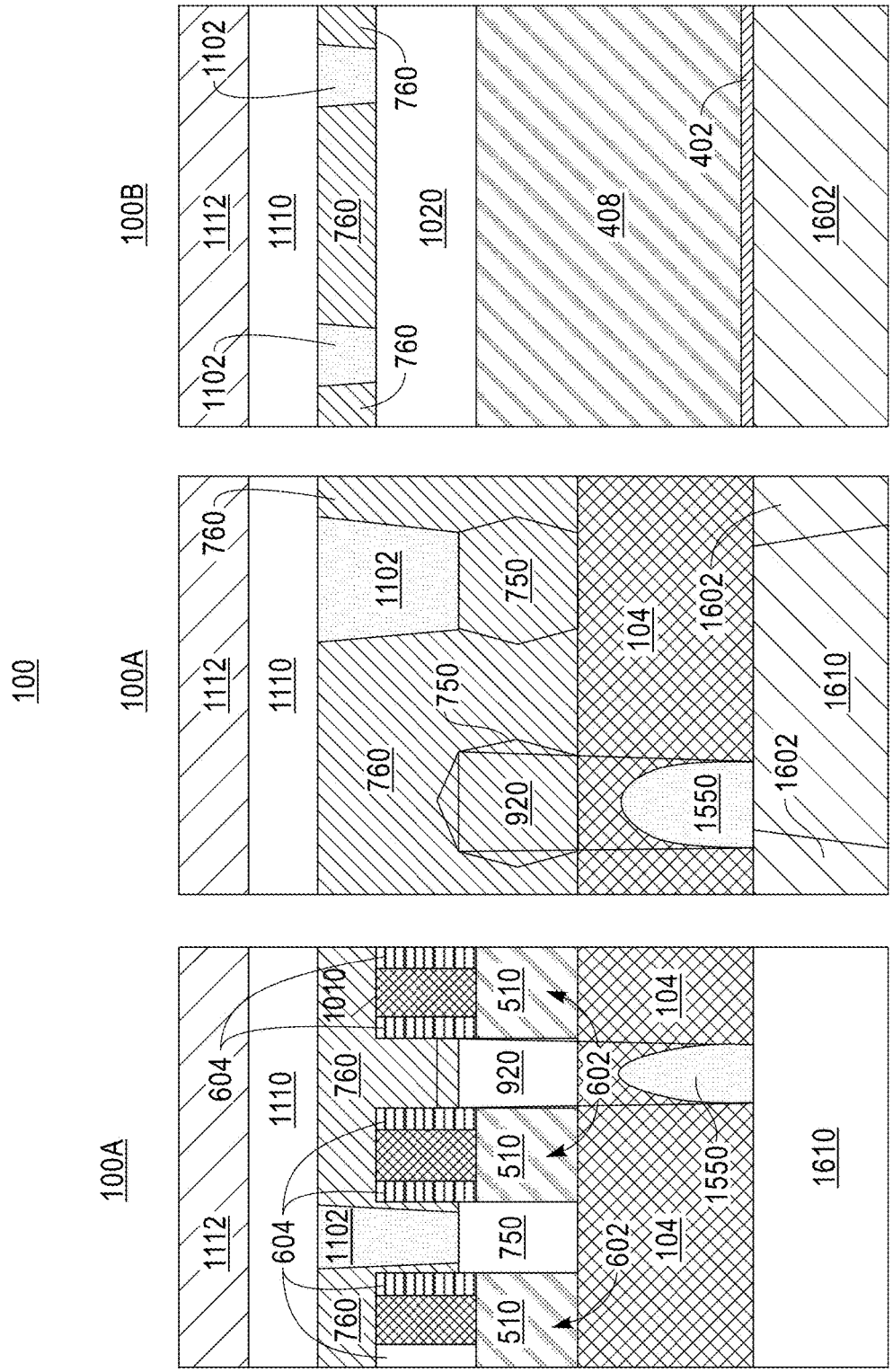

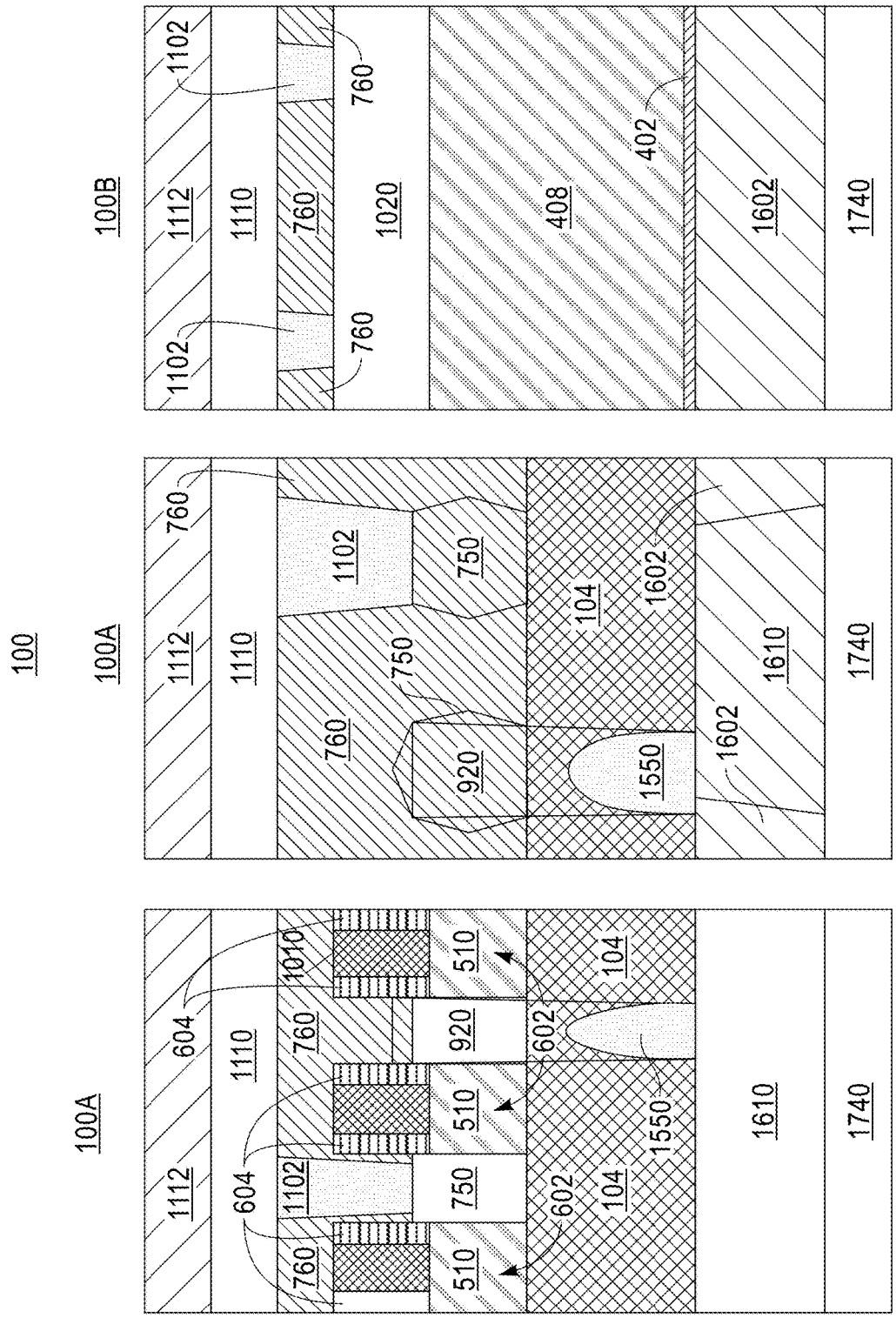

SEMICONDUCTOR PASSIVE DEVICE INTEGRATION FOR SILICON-ON-INSULATOR SUBSTRATE

BACKGROUND

The present invention generally relates to the field of semiconductor devices, and more particularly to backside power delivery.

Modern integrated circuits (IC) are made up of transistors, capacitors, and other devices that are formed on semiconductor substrates. On a substrate, these devices are initially isolated from one another but are later interconnected together to form functional circuits. Typical interconnect structures include lateral interconnections, such as metal lines (wirings), and vertical interconnects, such as vias and contacts. Power is provided to the integrated circuits through power rails, which are in the metal layers of integrated circuits. For example, the bottom metal layer ($M_0$ or $M_1$) may include a plurality of metal lines such as VDD power rails and VSS power rails.

As ICs continue to scale downward in size, backside power rails (BPRs), i.e., power rails that are formed in the backside of the wafer, usually under the transistor "fins", and backside power delivery ("backside" is below the transistor substrate) have been proposed to alleviate design challenges and enable technology scaling beyond the 5 nm technology node. The BPR technology can free up resources for dense logic connections that limit modern processor performance, enable further scaling of a standard logic cell by removing the overhead in the area occupied by the power rails, and allow thicker low-resistance power rails that enable lower voltage (IR) drops. One way to implement BPR technology and facilitate process integration includes forming backside contacts for logic devices using a silicon-on-insulator (SOI) substrate. However, this may require complete removal of the silicon substrate located below the buried oxide layer of the SOI substrate, which is not compatible with passive devices typically formed over a silicon layer including, for example, ESD diodes.

SUMMARY

According to an embodiment of the present disclosure, a semiconductor structure includes a logic device region composed of a plurality of field effect transistors, each field effect transistor including a gate structure and a source/drain region disposed on opposing sides of the gate structure, at least one source/drain region of a field effect transistor extends within a buried dielectric layer for electrically connecting the field effect transistor to a backside power rail. The semiconductor structure further includes a passive device region composed of a plurality of passive devices disposed on a first side of a first semiconductor layer and a second semiconductor layer disposed above a second side of the first semiconductor layer opposing the first side of the first semiconductor layer, and a backside interlevel dielectric located above the second semiconductor layer in the passive device region and above the buried dielectric layer in the logic device region, the backside power rail is embedded within the backside interlevel dielectric in the logic device region, a top surface of the backside interlevel dielectric in the passive device region is coplanar with a top surface of the backside power rail and the backside interlevel dielectric in the logic device region.

According to another embodiment of the present disclosure a method of forming a semiconductor structure includes forming a logic device region having a plurality of field effect transistors, each field effect transistor including a gate structure and a source/drain region disposed on opposing sides of the gate structure, at least one source/drain region of a field effect transistor extends within a buried dielectric layer for electrically connecting the field effect transistor to a backside power rail, forming a passive device region having a plurality of passive devices disposed on a first side of a first semiconductor layer and a second semiconductor layer disposed above a second side of the first semiconductor layer opposing the first side of the first semiconductor layer, and forming a backside interlevel dielectric above the second semiconductor layer in the passive device region and above the buried dielectric layer in the logic device region, the backside power rail is embedded within the backside interlevel dielectric in the logic device region, a top surface of the backside interlevel dielectric in the passive device region is coplanar with a top surface of the backside power rail and the backside interlevel dielectric in the logic device region.

BRIEF DESCRIPTION OF THE DRAWINGS

The following detailed description, given by way of example and not intended to limit the invention solely thereto, will best be appreciated in conjunction with the accompanying drawings, in which:

FIG. 3A is a cross-sectional view of the logic device region taken along line X-X after forming a hardmask layer, according to an embodiment of the present disclosure;

FIG. 3B is a cross-sectional view of the logic device region taken along line Y-Y as depicted in FIG. 1;

FIG. 3C is a cross-sectional view of the passive device region of the semiconductor structure after removing a buried dielectric layer and a first semiconductor;

FIG. 4A is a cross-sectional view of the logic device region taken along line X-X, according to an embodiment of the present disclosure;

FIG. 4B is a cross-sectional view of the logic device region taken along line Y-Y as depicted in FIG. 1.

FIG. 4C is a cross-sectional view of the passive device region of the semiconductor structure after forming a first etch stop layer and a second semiconductor layer;

FIG. 5A is a cross-sectional view of the logic device region taken along line X-X after patterning a plurality of fins and removing the hardmask layer, according to an embodiment of the present disclosure;

FIG. 5B is a cross-sectional view of the logic device region taken along line Y-Y as depicted in FIG. 1;

FIG. 5C is a cross-sectional view of the passive device region of the semiconductor structure 100;

FIG. 6A is a cross-sectional view of the logic device region taken along line X-X shown after forming a dummy gate, a gate hardmask, and sidewalls spacers, according to an embodiment of the present disclosure;

FIG. 6B is a cross-sectional view of the logic device region taken along line Y-Y as depicted in FIG. 1;

FIG. 7A is a cross-sectional view of the logic device region taken along line X-X after forming source/drain regions, according to an embodiment of the present disclosure;

FIG. 7B is a cross-sectional view of the logic device region taken along line Y-Y as depicted in FIG. 1;

FIG. 8A is a cross-sectional view of the logic device region taken along line X-X after forming a first interlevel dielectric layer and conducting a planarization process, according to an embodiment of the present disclosure;

FIG. 8B is a cross-sectional view of the logic device region taken along line Y-Y as depicted in FIG. 1;

FIG. 9A is a cross-sectional view of the logic device region taken along line X-X after forming a first mask layer, according to an embodiment of the present disclosure;

FIG. 9B is a cross-sectional view of the logic device region taken along line Y-Y as depicted in FIG. 1;

FIG. 9C is a top-down view of the semiconductor structure;

FIG. 10A is a cross-sectional view of the logic device region taken along line X-X after forming a second etch stop layer and a first epitaxial layer, according to an embodiment of the present disclosure;

FIG. 10B is a cross-sectional view of the logic device region taken along line Y-Y as depicted in FIG. 1;

FIG. 11A is a cross-sectional view of the logic device region taken along line X-X after conducting a replacement metal gate, according to an embodiment of the present disclosure;

FIG. 11B is a cross-sectional view of the logic device region taken along line Y-Y as depicted in FIG. 1;

FIG. 11C is a cross-sectional view of the passive device region of the semiconductor structure after forming passive devices;

FIG. 12A is a cross-sectional view of the logic device region taken along line X-X after middle-of-line contact patterning and metallization, forming a back-end-of-line interconnect level and carrier wafer bonding, according to an embodiment of the present disclosure;

FIG. 12B is a cross-sectional view of the semiconductor structure taken along line Y-Y as depicted in FIG. 1;

FIG. 12C is a cross-sectional view of the passive device region of the semiconductor structure;

FIG. 13A is a cross-sectional view of the logic device region taken along line X-X after wafer flipping and removal of a semiconductor substrate, according to an embodiment of the present disclosure;

FIG. 13B is a cross-sectional view of the logic device region taken along line Y-Y as depicted in FIG. 1;

FIG. 13C is a cross-sectional view of the passive device region of the semiconductor structure;

FIG. 15A is a cross-sectional view of the logic device region taken along line X-X after backside contact metallization, according to an embodiment of the present disclosure;

FIG. 15B is a cross-sectional view of the logic device region taken along line Y-Y as depicted in FIG. 1;

FIG. 15C is a cross-sectional view of the passive device region of the semiconductor structure;

FIG. 16A is a cross-sectional view of the logic device region taken along line X-X after forming a backside power rail within a backside interlevel dielectric, according to an embodiment of the present disclosure;

FIG. 16B is a cross-sectional view of the logic device region taken along line Y-Y as depicted in FIG. 1;

FIG. 16C is a cross-sectional view of the passive device region of the semiconductor structure after depositing the backside interlevel dielectric;

FIG. 17A is a cross-sectional view of the logic device region taken along line X-X after forming a backside power delivery network, according to an embodiment of the present disclosure;

FIG. 17B is a cross-sectional view of the logic device region taken along line Y-Y as depicted in FIG. 1; and FIG. 17C is a cross-sectional view of the passive device region of the semiconductor structure depicting the backside power delivery network.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
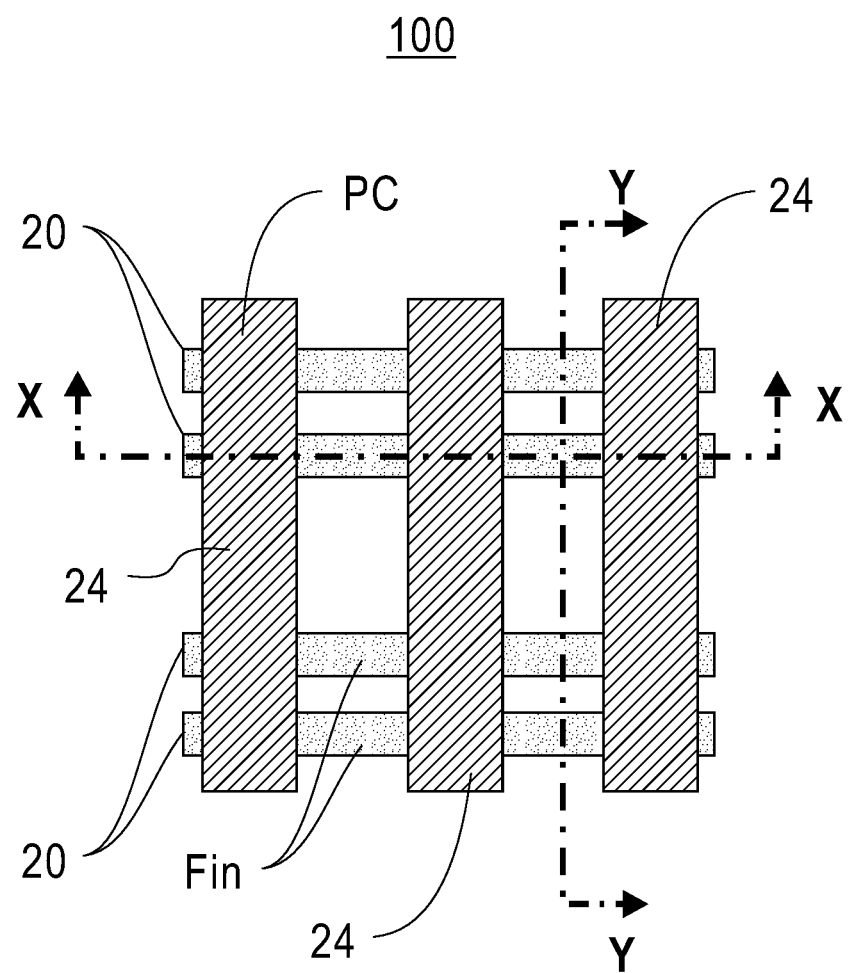
FIG. 1 is a top-down view of a semiconductor structure at an intermediate step during a semiconductor manufacturing process depicting different cross-sectional views used to describe embodiments of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It is understood that although the disclosed embodiments include a detailed description of an exemplary FinFET architecture, implementation of the teachings recited herein are not limited to the particular FET architecture described herein. Rather, embodiments of the present invention are capable of being implemented in conjunction with any other type of FET device now known or later developed including, but not limited to, planar FETs, nanowire transistors, nanosheet transistors, nanoribbon transistors, etc.

As described above, one way to implement BPR technology and facilitate process integration includes forming backside contacts for logic devices using a silicon-on-insulator (SOI) substrate. However, this may require complete removal of the silicon substrate located below the buried oxide layer of the SOI substrate, which is not compatible with passive devices typically formed over a silicon layer including, for example, ESD diodes.

Therefore, embodiments of the present disclosure provide a semiconductor structure, and a method of making the same, in which fabrication of backside contacts and a backside power delivery network (BPDN) in a logic device region is integrated with the formation of passive devices in a passive device region for improved device scaling. The backside contacts and backside power rails are formed by backside processes which are performed after completing BEOL processes and flipping the wafer over. In the proposed embodiments, a block mask formed on the passive device region allows recessing a portion of one or more source/drain regions embedded within the buried oxide layer (i.e., the one or more source/drain regions extend below the channel region) to form the backside contacts. After forming the backside contacts, a surface of a silicon-germanium layer in the passive device region is substantially even with a surface of the buried oxide layer and backside contacts in the logic device region. A silicon layer disposed above the silicon-germanium layer allows the formation of passive devices in the passive device region and the formation of backside contacts in the logic device region at substantially the same level of the silicon-germanium layer.

According to an embodiment, the proposed method includes removing silicon and buried oxide layers from the passive device region of a silicon-on-insulator (SOI) wafer, growing a silicon-germanium etch stop layer, growing a silicon epitaxial layer above the silicon-germanium etch stop in the passive device region, forming field effect transistors with deep source/drain epi through the buried oxide layer, forming passive devices over the silicon epi in the passive device region, forming middle-of-line contacts, forming back-end-of-line interconnects and bonding carrier wafer, flipping the semiconductor wafer, removing the substrate stopping on the buried oxide layer and silicon-germanium etch stop, protecting passive device region with a mask, recessing the deep source/drain epi, forming backside contacts in the recesses, and forming backside power rails and the backside power delivery network.

Embodiments by which the semiconductor structure with integrated passive device region can be formed are described in detailed below by referring to the accompanying drawings in FIGS. 1-17C.

Referring now to FIG. 1, a top-down view of a logic device region of a semiconductor structure 100 is shown at an intermediate step during a semiconductor manufacturing process, according to an embodiment of the present disclosure. Particularly, FIG. 1 depicts different cross-sectional views of the semiconductor structure 100 that will be used to describe embodiments of the present disclosure. The cross-sectional views are taken along line X-X and line Y-Y, as depicted in the figure. Specifically, line X-X represents a cut along a fin structure or fin region 20 and across gate structures or gate regions 24 of the semiconductor structure 100, while line Y-Y represents a cut across fin structures or fin regions 20 of the semiconductor structure 100.

Figures 2A, 2B, 2C:
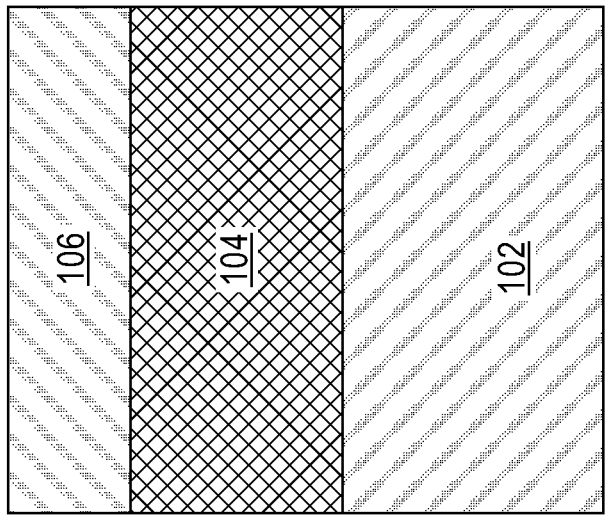
FIG. 2A is a cross-sectional view of the semiconductor structure taken along line X-X depicting a logic device region, according to an embodiment of the present disclosure.
FIG. 2B is a cross-sectional view of the logic device region taken along line Y-Y as depicted in FIG. 1.
FIG. 2C is a cross-sectional view of a passive device region of the semiconductor structure.

Referring now to FIGS. 2A-2C, cross-sectional views of the semiconductor structure 100 including a first or logic device region 100A and a second or passive device region 100B are shown, according to an embodiment of the present disclosure. In this embodiment, FIG. 2A is a cross-sectional view of the logic device region 100A of the semiconductor structure 100 taken along line X-X as depicted in FIG. 1. FIG. 2B is a cross-sectional view of the logic device region 100A taken along line Y-Y as depicted in FIG. 1. FIG. 2C is a cross-sectional view of the passive device region 100B of the semiconductor structure 100.

At this step of the manufacturing process, the semiconductor structure 100 includes a silicon-on-insulator (SOI) substrate composed of a base substrate 102 (hereinafter "substrate"), a buried dielectric layer 104 disposed above the substrate 102, and a SOI layer or first semiconductor layer 106 disposed above the buried dielectric layer 104. The buried dielectric layer 104 isolates the first semiconductor layer 106 from the substrate 102. According to an embodiment, the buried dielectric layer 104 and the first semiconductor layer 106 are vertically stacked one on top of another in a direction perpendicular to the substrate 102, as illustrated in the figure.

The substrate 102 may be made of any semiconductor material including, but not limited to, silicon, germanium, silicon-germanium alloy, carbon-doped silicon, carbon-doped silicon-germanium alloy, and compound semiconductor materials. In the depicted example, the substrate 102 is made of silicon. Typically, the substrate 102 may be about, but is not limited to, several hundred microns thick. For example, the substrate 102 may include a thickness ranging from approximately 500 um to approximately 1500 um.

The buried dielectric layer 104 may be formed using conventional processes for SOI wafer fabrication. The buried dielectric layer 104 may include a thickness ranging from approximately 50 nm to approximately 200 nm.

The first semiconductor layer 106 and the substrate 102 may have the same or different crystal orientation. For example, the crystal orientation of the substrate 102 and/or the first semiconductor layer 106 may be {100}, {110}, or {111}. Other crystallographic orientations besides those specifically mentioned may also be used in the present application. The substrate 102 and/or the first semiconductor layer 106 may be a single crystalline semiconductor material, a polycrystalline material, or an amorphous material. Typically, at least the first semiconductor layer 106 may be a single crystalline semiconductor material. Methods for forming the first semiconductor layer 106 are well known in the art. Non-limiting examples include SIMOX (Separation by Implantation of Oxygen), wafer bonding, and ELTRAN® (Epitaxial Layer TRANsfer). The first semiconductor layer 106 may include a thickness ranging from about 20 nm to about 100 nm that may be entirely consumed during patterning of fin structures, as will be described in detail below.

Referring now to FIGS. 3A-3C, cross-sectional views of the semiconductor structure 100 are shown after forming a first hardmask layer 202 on the logic device region 100A, and removing the buried dielectric layer 104 and first semiconductor layer 106 from the passive device region 100B, according to an embodiment of the present disclosure. In this embodiment, FIG. 3A is a cross-sectional view of the logic device region 100A taken along line X-X as depicted in FIG. 1. FIG. 3B is a cross-sectional view of the logic device region 100A taken along line Y-Y as depicted in FIG. 1. FIG. 3C is a cross-sectional view of the passive device region 100B of the semiconductor structure 100.

In this embodiment, the first hardmask layer 202 is formed over the first semiconductor layer 106 in the logic device region 100A by depositing a hard mask material (e.g., silicon nitride) using, for example, chemical vapor deposition (CVD), plasma enhanced CVD (PECVD) or any suitable technique for dielectric deposition. By way of example only, the first hardmask layer 202 may be formed having a thickness varying from approximately 20 nm to approximately 200 nm, although thicknesses greater than 200 nm and less than 20 nm may also be used.

After depositing the first hardmask layer 202 on the logic device region 100A, any suitable etching process can be conducted on the passive device region 100B to selectively remove the buried dielectric layer 104 and first semiconductor layer 106. In an exemplary embodiment, a dry etch process can be used to remove the buried dielectric layer 104 and first semiconductor layer 106 from the passive device region 100B.

Referring now to FIGS. 4A-4C, cross-sectional views of the semiconductor structure 100 are shown after forming a first etch stop layer 402 and a second semiconductor layer 408 on the passive device region 100B, according to an embodiment of the present disclosure. In this embodiment, FIG. 4A is a cross-sectional view of the logic device region 100A taken along line X-X as depicted in FIG. 1. FIG. 4B is a cross-sectional view of the logic device region 100A taken along line Y-Y as depicted in FIG. 1. FIG. 4C is a cross-sectional view of the passive device region 100B of the semiconductor structure 100.

The first etch stop layer 402 can be formed on the substrate 102 using an epitaxial growth process. For instance, in the described embodiment, the first etch stop layer 402 is formed by epitaxially growing a layer of SiGe with a germanium concentration varying from approximately 15 atomic percent to approximately 35 atomic percent. In some embodiments, the first etch stop layer 402 can be made of epitaxially grown SiGe with a germanium concentration of approximately 30 atomic percent. In one or more embodiments, the first etch stop layer 402 acts as an etch stop layer during subsequent substrate removal. Similarly, the second semiconductor layer 408 can be formed by epitaxially growing a Si layer to a thickness varying from approximately 30 nm to approximately 250 nm, although other thicknesses are within the contemplated scope of the invention.

In general, the first etch stop layer 402 and the second semiconductor layer 408 can be formed by epitaxial growth by using the substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the first etch stop layer 402 and the second semiconductor layer 408. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

In one or more embodiments, an uppermost surface of the second semiconductor layer 408 is substantially coplanar with an uppermost surface of the first semiconductor layer 106, as depicted in the figures.

Referring now to FIGS. 5A-5C, cross-sectional views of the semiconductor structure 100 are shown after patterning a plurality of fins 510 (hereinafter "fins") in the logic device region 100A and removing the first hardmask layer 202, according to an embodiment of the present disclosure. In this embodiment, FIG. 5A is a cross-sectional view of the logic device region 100A taken along line X-X as depicted in FIG. 1. FIG. 5B is a cross-sectional view of the logic device region 100A taken along line Y-Y as depicted in FIG. 1. FIG. 5C is a cross-sectional view of the passive device region 100B of the semiconductor structure 100.

According to an embodiment, the first hardmask layer 202 is removed from the semiconductor structure 100, followed by deposition of fresh hardmask material (not shown) to conduct a fin patterning process. A photolithographic patterning can be conducted on the deposited hardmask material (not shown) to form a plurality of individual fin hardmasks. A reactive ion etching (RIE) can then be used to etch through the first semiconductor layer 106 to form fins 510. The etching process may continue until reaching a top portion of the buried dielectric layer 104, as shown in FIG. 5B. As known by those skilled in the art, the fins 510 may be formed by any method known in the art including, for example, a sidewall image transfer (SIT) technique. It should be noted that, while the embodiment depicted in FIG. 5B includes four fins 510, any number of fins may be formed from the first semiconductor layer 106. In an exemplary embodiment, the fins 510 may have a height ranging from approximately 25 nm to approximately 100 nm, a width ranging from approximately 5 nm to approximately 20 nm and may be separated by a space ranging from approximately 20 nm to 100 nm. After forming the fins 510, any suitable etching process can be conducted to remove the deposited hardmask material (not shown) selective to the fins 510.

Referring now to FIGS. 6A-6B, cross-sectional views of the semiconductor structure 100 are shown after forming a dummy gate 610, a gate hardmask 620, and sidewalls spacers 604, according to an embodiment of the present disclosure. In this embodiment, FIG. 6A is a cross-sectional view of the logic device region 100A taken along line X-X as depicted in FIG. 1. FIG. 6B is a cross-sectional view of the logic device region 100A taken along line Y-Y as depicted in FIG. 1.

Known semiconductor fabrication operations have been used to form the semiconductor structure 100 as depicted in FIGS. 6A-6B. Thus, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

With continued reference to FIGS. 6A-6B, the semiconductor structure 100 may further include a sacrificial or dummy gate stack typically consisting of a dummy gate 610 disposed above a portion of the fins 510 corresponding to a channel region 602 and a sacrificial gate hardmask 620 disposed above the dummy gate 610. In some embodiments, the dummy gate stack further includes a sacrificial gate oxide (not shown) disposed between the portion of the fins 510 corresponding to the channel region 602 and the dummy gate 610. It should be noted that the described FinFET device may be fabricated using either a replacement metal gate (RMG) or gate last process flow, or a gate first process flow. For illustration purposes only, without intent of limitation, the embodiment described below uses a gate last process flow.

In this embodiment, the channel region 602 of the semiconductor structure 100 corresponds to the portion or section of the fins 510 covered by (i.e., below) the sacrificial gate stack (i.e., the dummy gate 610, and the sacrificial gate hardmask 620). The portion of the fins 510 not covered by the sacrificial gate structure defines the source/drain regions of the semiconductor structure 100. However, it should be noted that embodiments of the present disclosure can be applied to other device configurations including planar and gate-all-around (GAA) transistors.

In one or more embodiments, the dummy gate 610 is formed from amorphous silicon (a-Si), and the sacrificial gate hardmask 620 is formed from silicon nitride (SiN), silicon oxide, an oxide/nitride stack, or similar materials and configurations. The sacrificial gate hardmask 620 is typically formed over the dummy gate 610 to act as an etch stop. It should be noted that the process of forming the sacrificial gate stack is typical and well-known in the art. In embodiments in which the sacrificial gate stack includes a sacrificial gate oxide (not shown), the sacrificial gate oxide is made of an oxide material including, but not limited to, $SiO_2$, $HfO_2$, $ZrO_2$, $Al_2O_3$, $TiO_2$, $La_2O_3$, $SrTiO_3$, $LaAlO_3$, and mixtures thereof.

Sidewall spacers 604 are formed along sidewalls of the dummy gate 610 and gate hardmask 620, as depicted in FIG. 6A. In an exemplary embodiment, sidewalls spacers 604 can be formed by deposition of a spacer material followed by directional RIE of the deposited spacer material. While the sidewall spacers 604 are herein described in the plural, the sidewall spacers 604 may consist of a single spacer surrounding the sacrificial gate structure formed by the dummy gate 610 and the sacrificial gate hardmask 620. In this embodiment, the sidewall spacers 604 extends outwards from the sacrificial gate structure. Stated differently, the sidewall spacers 604 are formed on portions of the fins 510 not covered by the dummy gate 610. In an exemplary embodiment, a thickness (or horizontal width) of the sidewall spacers 604 may be approximately 6 nm, although thicknesses below or above this value may also be considered.

Referring now to FIGS. 7A-7B, cross-sectional views of the semiconductor structure 100 are shown after forming source/drain regions 750, according to an embodiment of the present disclosure. In this embodiment, FIG. 7A is a cross-sectional view of the logic device region 100A taken along line X-X as depicted in FIG. 1. FIG. 7B is a cross-sectional view of the logic device region 100A taken along line Y-Y as depicted in FIG. 1.

The process of forming the source/drain regions 750 typically includes etching upper portions of the fins 510 not covered by the dummy gate 610 and sidewall spacers 604 (i.e., portions of the fins 510 adjacent to the channel region 602) to form source/drain recesses (not shown). In an exemplary embodiment, a RIE process can be used to recess such portions of the fins 510. An epitaxial layer growth process is then performed on the exposed surfaces of the recessed fins 510. In one or more embodiments, an in-situ doped material (e.g., phosphorus-doped silicon (Si:P) for n-type FETs or boron-doped silicon germanium (SiGe:B) for p-type FETs) is epitaxially grown within the source/drain recesses (not shown) to form the source/drain regions 750. In general, the source/drain regions 750 can be formed by epitaxial growth by using the recessed silicon fins as the seed layer.

Referring now to FIGS. 8A-8B, cross-sectional views of the semiconductor structure 100 are shown after forming a first interlevel dielectric layer 706 and conducting a planarization process, according to an embodiment of the present disclosure. In this embodiment, FIG. 8A is a cross-sectional view of the portions of the fins 510 taken along line X-X as depicted in FIG. 1. FIG. 8B is a cross-sectional view of the portions of the fins 510 taken along line Y-Y as depicted in FIG. 1.

Typically, after forming source/drain regions 750, the first interlevel dielectric layer 706 can be formed to fill voids in the semiconductor structure 100. The first interlevel dielectric layer 706 can be formed by, for example, CVD of a dielectric material. Non-limiting examples of dielectric materials to form the first interlevel dielectric layer 706 may include silicon oxide, silicon nitride, hydrogenated silicon carbon oxide, silicon based low-k dielectrics, flowable oxides, porous dielectrics, or organic dielectrics including porous organic dielectrics. As known by those skilled in the art, after depositing the first interlevel dielectric layer 706, a planarization process (e.g., CMP) can be conducted on the semiconductor structure 100 to remove excess materials and create a smooth surface.

Referring now to FIGS. 9A-9B, cross-sectional views of the semiconductor structure 100 are shown after forming a first mask layer 802 on the logic device region 100A, according to an embodiment of the present disclosure. In this embodiment, FIG. 9A is a cross-sectional view of the logic device region 100A taken along line X-X as depicted in FIG. 1. FIG. 9B is a cross-sectional view of the logic device region 100A taken along line Y-Y as depicted in FIG. 1. FIG. 9C is a top-down view of the logic device region 100A of the semiconductor structure 100.

In one or more embodiments, the first mask layer 802 can be made of any organic planarizing material that is capable of effectively preventing damage of underlying layers during subsequent etching processes. The first mask layer 802 can include, but is not necessarily limited to, an organic polymer including C, H, and N. In an embodiment, the organic planarizing material can be free of silicon (Si). In another embodiment, the organic planarizing material can be free of Si and fluorine (F). As defined herein, a material is free of an atomic element when the level of the atomic element in the material is at or below a trace level detectable with analytic methods available in the art. Non-limiting examples of organic planarizing materials for forming the first mask layer 802 may include JSR HM8006, JSR HM8014, AZ UM10M2, Shin Etsu ODL 102, or other similar commercially available materials. The first mask layer 802 may be deposited by, for example, spin coating.

A lithography process followed by an etching process can be conducted on the semiconductor structure 100 for etching the first mask layer 802 and forming recesses 810, as depicted in the figures. In some embodiments, etching the first mask layer 802 can be conducted by, for example, an OPL RIE including a trace point detection.

As can be observed in FIGS. 9A and 9C, the recesses 810 extend through a portion of the fins 510 corresponding to at least one source/drain region 750 until an uppermost surface of the substrate 102. The at least one source/drain region 750 to be recessed is selected based on design requirements.

Referring now to FIGS. 10A-10B, cross-sectional views of the semiconductor structure 100 are shown after forming a second etch stop layer 910 and a first epitaxial layer 920 within the recesses 810, according to an embodiment of the present disclosure. In this embodiment, FIG. 10A is a cross-sectional view of the logic device region 100A taken along line X-X as depicted in FIG. 1. FIG. 10B is a cross-sectional view of the logic device region 100A taken along line Y-Y as depicted in FIG. 1.

The second etch stop layer 910 is formed similarly to the first etch stop layer 402 described above with reference to FIGS. 4A-FIG. 4C. Thus, the second etch stop layer 910 can be formed off the substrate 102 using an epitaxial growth process to act as an etch stop layer. According to an embodiment, the second etch stop layer 910 is formed by epitaxially growing a layer of SiGe with a germanium concentration varying from approximately 15 atomic percent to approximately 35 atomic percent. In some embodiments, the second etch stop layer 910 can be made of epitaxially grown SiGe with a germanium concentration of approximately 30 atomic percent. In one or more embodiments, the second etch stop layer 910 acts as an etch stop layer during subsequent substrate removal.

After forming the second etch stop layer 910, an epitaxial layer 920 is formed within the recesses 810. More particularly, at this step of the fabrication process, source/drain regions 750 are regrown by forming the epitaxial layer 920. Specifically, at least one source/drain region 750 is extended to a depth past or below the channel region 602 by forming the epitaxial layer 920 within the recesses 810 (FIGS. 8A-8B). As may be understood, the epitaxial layer 920 includes similar materials and dopant concentration as the initial source/drain regions 750. Although not depicted in the figures, after forming the epitaxial layer 920 for regrowing source/drain regions 750, remaining voids within the semiconductor structure 100 are filled with a dielectric material substantially similar to the first dielectric layer 760 followed by a planarization process. This planarization process may expose a top surface of the dummy gate 610 in preparation for a replacement metal gate process, as will be described in detail below.

Referring now to FIGS. 11A-11C, cross-sectional views of the semiconductor structure 100 are shown after conducting a replacement metal gate process in the logic device region 100A and forming passive devices 1020 in the passive device region 100B, according to an embodiment of the present disclosure. In this embodiment, FIG. 11A is a cross-sectional view of the logic device region 100A taken along line X-X as depicted in FIG. 1. FIG. 11B is a cross-sectional view of the logic device region 100A taken along line Y-Y as depicted in FIG. 1. FIG. 11C is a cross-sectional view of the passive device region 100B of the semiconductor structure 100.

According to an embodiment, in a gate-last fabrication process, the dummy gate 610 is replaced with a high-k metal gate structure, i.e., a replacement gate 1010. The replacement gate 1010 includes gate dielectrics, such as hafnium oxide ($HfO_2$), zirconium dioxide ($ZrO_2$), hafnium-aluminum oxide (HfAlOx), hafnium-lanthanum oxide g (HfLaOx), etc., and one or more work function metals including, but not limited to, titanium nitride (TiN), tantalum nitride (TaN), titanium carbide (TiC), titanium aluminum carbide (TiAlC), and conducting metals including, for example, aluminum (Al), tungsten (W) or cobalt (Co). Although not depicted in the figures, a gate cap is typically formed above the replacement gate 1010. After forming the replacement gate 1010, a chemical mechanical polishing (CMP) may be conducted to remove excess material and polish upper surfaces of the semiconductor structure 100.

Also, at this step of the fabrication process, passive devices 1020 may be formed on the passive device region 100B above the second semiconductor layer 408. It should be noted that for ease of illustration, without intent of limitation, the passive devices 1020 are simplistically depicted in FIG. 11C. As may be understood, the passive devices 1020 may include a plurality of electrical components that do not require backside power supply. Non-limiting examples of passive devices 1020 in the passive device region 100B may include diodes, capacitors, resistors, and the like.

Referring now to FIGS. 12A-12C, cross-sectional views of the semiconductor structure 100 are shown after middle-of-line (MOL) contact patterning and metallization, forming a back-end-of-line (BEOL) interconnect level 1110 and carrier wafer bonding, according to an embodiment of the present disclosure. In this embodiment, FIG. 12A is a cross-sectional view of the logic device region 100A taken along line X-X as depicted in FIG. 1. FIG. 12B is a cross-sectional view of the logic device region 100A taken along line Y-Y as depicted in FIG. 1. FIG. 12C is a cross-sectional view of the passive device region 100B of the semiconductor structure 100.

As illustrated in the figure, a plurality of conductive structures, i.e., metal contacts 1102 are formed in the semiconductor structure 100 for electrically connecting front-end-of-line (FEOL) devices to subsequently formed metal levels. The process of forming the metal contacts 1102 is standard and well-known in the art. Typically, the process includes forming trenches (not shown) within the first dielectric layer 760 and subsequently filling the trenches with a conductive material or a combination of conductive materials to form the metal contacts 1102. In one or more embodiments, the conductive material filling the metal contacts 1102 may include a silicide liner (e.g., titanium (Ti), nickel (Ni), nickel-platinum (NiPt) alloy, etc.), a metal adhesion liner (e.g., titanium nitride (TiN)), and a conductive metal (e.g., aluminum (Al), tungsten (W), copper (Co), ruthenium (Ru), or any combination thereof).

The conductive material may be deposited by a suitable deposition process, for example, CVD, PECVD, PVD, plating, thermal or e-beam evaporation, or sputtering. A planarization process, for example, CMP, is performed to remove any conductive material from upper surfaces of the semiconductor structure 100. In the depicted example, metal contacts 1102 include source/drain contacts that extend until an uppermost surface of each of the source/drain regions 750 and passive devices 1020. Although not depicted in the figures, gate contacts to the replacement gate 1010 can also be formed during this step of the manufacturing process.

With continued reference to FIGS. 12A-12C, a BEOL interconnect level 1110 is formed above the FEOL device level 30 in the logic device region 100A and above passive devices 1020 in the passive device region 100B of the semiconductor structure 100.

Although not depicted in the figures, the BEOL interconnect level 1110 typically includes contacts, insulating layers (dielectrics), metal levels, and bonding sites for chip-to-package connections, as may be known by those skilled in the art. As mentioned above, various steps in the manufacture of semiconductor devices and semiconductor-based ICs are well known and so, in the interest of brevity, many conventional steps will only be mentioned briefly herein or will be omitted entirely without providing the well-known process details.

According to an embodiment, after forming the BEOL interconnect level 1110, the semiconductor structure 100 (i.e., the semiconductor wafer) is bonded to a carrier wafer (or auxiliary substrate) 1112. The carrier wafer 1112 may act as a reinforcing substrate for providing mechanical strength during processing (e.g., thinning) of the semiconductor wafer. The process of bonding the semiconductor wafer to the carrier wafer 1112 can be achieved by conventional wafer bonding process, such as dielectric-to-dielectric bonding or Cu-to-Cu bonding.

Accordingly, the carrier wafer 1112 may include silicon oxide layers or SiCN layers, or any other layers applicable in the direct bonding technology applied in state-of-the-art packaging techniques. Bonding of the device wafer to the carrier wafer 1112 takes place by such known direct bonding techniques, thus obtaining the assembly shown in FIGS. 12A-12C.

Referring now to FIGS. 13A-13B, cross-sectional views of the semiconductor structure 100 are shown after wafer flipping and removal of the substrate 102, according to an embodiment of the present disclosure. In this embodiment, FIG. 13A is a cross-sectional view of the logic device region 100A taken along line X-X as depicted in FIG. 1. FIG. 13B is a cross-sectional view of the logic device region 100A taken along line Y-Y as depicted in FIG. 1. FIG. 13C is a cross-sectional view of the passive device region 100B of the semiconductor structure 100.

In the depicted embodiment, after the wafer is flipped (not shown), the substrate 102 is removed using regular grinding, CMP and selective etching processes including wet or dry etching techniques. According to an embodiment, the grinding process is conducted until substantially removing the substrate 102 from the semiconductor structure 100 and only a few microns of Si remains. After that, an optional CMP process can be further used to reduce the thickness variation, and finally a highly selective Si etching process is used to remove the remaining substrate 102 from the semiconductor structure 100. In the depicted embodiment, the buried dielectric layer 104, second etch stop layer 910 and first etch stop layer 402 act as an etch stop during the highly selective Si removal process, preventing excessive Si etch which may damage the replacement gate 1010, source/drain regions 750, and the extended source/drain region 750 formed by the first epitaxial layer 920.

Figures 14A, 14B, 14C:
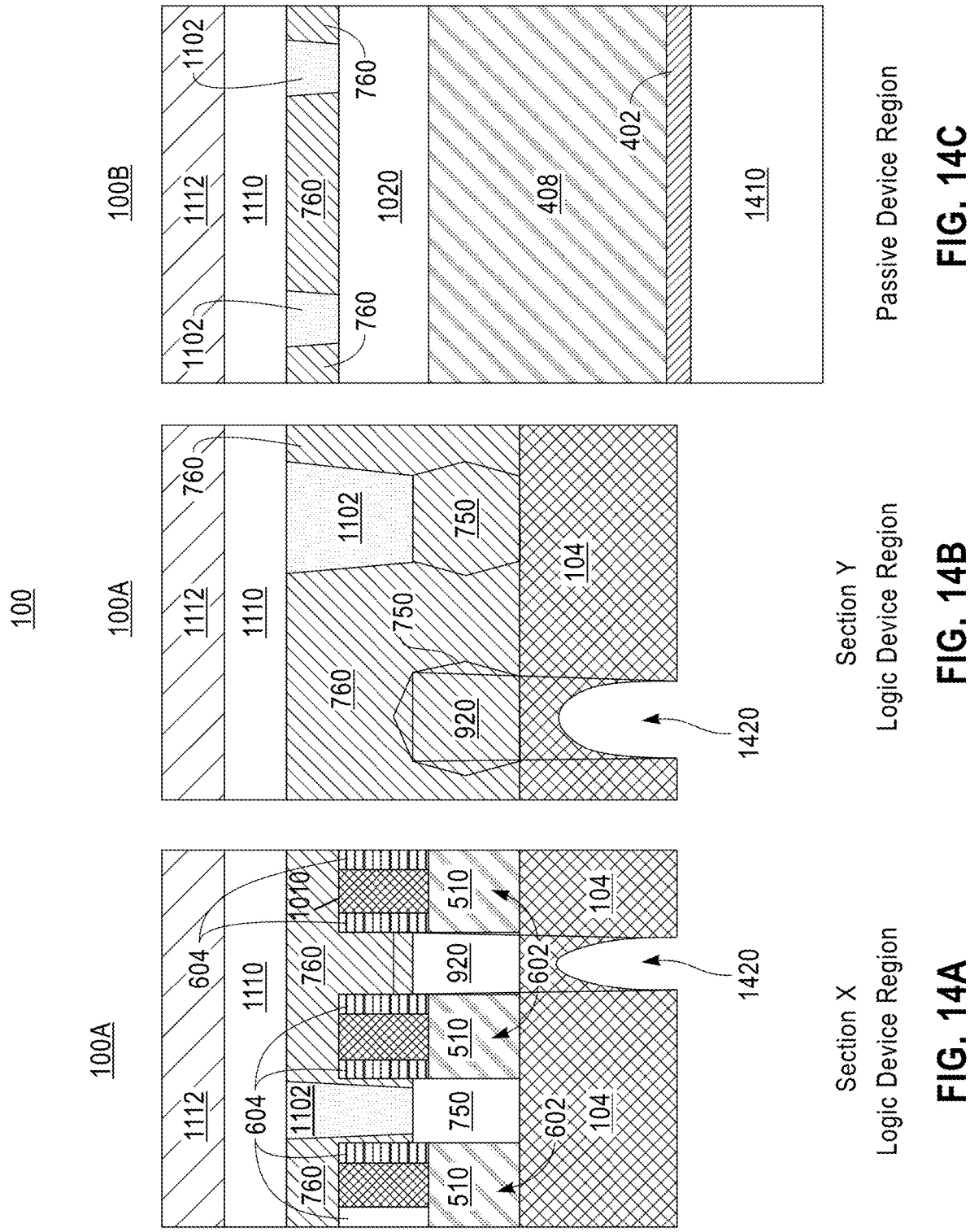
FIG. 14A is a cross-sectional view of the logic device region taken along line X-X after recessing an extended portion of the source/drain regions, according to an embodiment of the present disclosure.
FIG. 14B is a cross-sectional view of the logic device region taken along line Y-Y as depicted in FIG. 1.
FIG. 14C is a cross-sectional view of the passive device region of the semiconductor structure after forming a second mask layer for protecting the passive device region during recessing the extended portion of the source/drain regions.

Referring now to FIGS. 14A-14B, cross-sectional views of the semiconductor structure 100 are shown after forming a second mask layer on the passive device region 100B and recessing the extended portion of the source/drain regions 750, according to an embodiment of the present disclosure. In this embodiment, FIG. 14A is a cross-sectional view of the logic device region 100A taken along line X-X as depicted in FIG. 1. FIG. 14B is a cross-sectional view of the logic device region 100A taken along line Y-Y as depicted in FIG. 1. FIG. 14C is a cross-sectional view of the passive device region 100B of the semiconductor structure 100.

In this embodiment, a second mask layer 1410 is deposited directly above the first etch stop layer 402 located in the passive device region 100B. The second mask layer 1410 includes similar materials and is formed in analogous ways as the first mask layer 802 described above with reference to FIGS. 9A-9B. The second mask layer 410 protects the passive device region 100B during etching of the first epitaxial layer 920.

The process continues by recessing the first epitaxial layer 910. As described above, the first epitaxial layer 920 forms an extended source/drain region 750 within the buried dielectric layer 104 for electrically connecting backside conductive structures, as will be described in detail below. In one or more embodiments, recessing the first epitaxial layer 920 can be conducted using any etching process that allows etching the first epitaxial layer 920 selective to the buried dielectric layer 104. For example, a selective dry etch process. After recessing the first epitaxial layer 920, recesses 1420 are formed within the buried dielectric layer 104, as shown in FIGS. 14A-14B.

Referring now to FIGS. 15A-15B, cross-sectional views of the semiconductor structure 100 are shown after backside contact metallization, according to an embodiment of the present disclosure. In this embodiment, FIG. 15A is a cross-sectional view of the logic device region 100A taken along line X-X as depicted in FIG. 1. FIG. 15B is a cross-sectional view of the logic device region 100A taken along line Y-Y as depicted in FIG. 1. FIG. 15C is a cross-sectional view of the passive device region 100B of the semiconductor structure 100.

In the depicted embodiment, a backside metal is deposited in the semiconductor structure 100 substantially filling the recesses 1420 (FIGS. 14A-14B) to form backside metal contacts 1550 to the first epitaxial layer 920, i.e., extended source/drain region 750. The backside metal contacts 1550 are formed in direct contact with a first or bottom surface of one or more extended source/drain regions 750 according to design requirements. Although not depicted in the figure, it may be understood that, in one or more embodiments, the backside metal contacts 1550 can be formed between neighboring source/drain regions 750 located within NFET (i.e., N2N space) regions or PFET (i.e., P2P space) regions of the semiconductor structure 100.

The backside metal used to form the backside metal contacts 1550 may include similar conductive materials and be formed using analogous deposition processes as those used to form the metal contacts 1102. In some embodiments, forming the backside metal contacts 1102 may include depositing, for example, a silicide liner such as Ti, Ni, NiPt, an adhesion metal liner such as TiN, and a layer of low resistance metal, such as Ru, Co, W or Cu. After forming the backside metal contacts 1550, a planarization process (e.g., CMP) can be conducted on the semiconductor structure 100 to remove excess materials and create a smooth surface.

In the depicted embodiment, an uppermost surface of the backside metal contacts 1550 is coplanar with uppermost surfaces of the buried dielectric layer 104 and the first etch stop layer 402. Here, it should be noted that a thickness of the second semiconductor layer 408 in the passive device region 100B is equal to a thickness of the buried dielectric layer 104 plus a height of the active channel region 602 in the logic device region 100A.

Referring now to FIGS. 16A-16B, cross-sectional views of the semiconductor structure 100 are shown after forming backside power rails (BPRs) 1610 on the logic device region 100A, according to an embodiment of the present disclosure. In this embodiment, FIG. 16A is a cross-sectional view of the logic device region 100A taken along line X-X as depicted in FIG. 1. FIG. 16B is a cross-sectional view of the logic device region 100A taken along line Y-Y as depicted in FIG. 1. FIG. 16C is a cross-sectional view of the passive device region 100B of the semiconductor structure 100.

In this embodiment, prior to forming BPRs 1610 a backside interlayer dielectric (BILD) 1602 is deposited in the semiconductor structure 100. The BILD 1602 may be formed using standard methods and materials, such as those used to form the first dielectric layer 760. In an exemplary embodiment, a thickness of the BILD 1602 may vary between approximately 40 nm to approximately 300 nm, and ranges therebetween. In one or more embodiments, a planarization process (e.g., CMP) can be conducted on the semiconductor structure 100 after forming the BILD 1602.

With continued reference to FIGS. 16A-16C, the process of forming the BPRs 1610 includes patterning a backside power rail trench (not shown) in the BILD 1602, for example, by conventional lithography and reactive ion etching. In the depicted example, the backside power rail trench (not shown) is etched until reaching an uppermost surface of the backside metal contacts 1550, as shown in FIGS. 16A-16B. In some embodiments, the aspect ratio of the backside power rail trench (not shown) may be about 0.5 to 5.0.

To form the BPRs 1610 in the logic device region 100A of the semiconductor structure 100, the backside power rail trenches (not shown) can be filled with a conductive metal. The choice of metallization for backside power rails is based on where in the integration flow the rail is formed and metalized. In the depicted embodiment, the BPRs 1610 are formed in the backside of the semiconductor structure 100. In such instances the BPRs 1610 may be formed by depositing, for example, a layer of ruthenium (Ru) or Cu. In other embodiments, the conductive metal forming the BPRs 1610 may include Co, W, Al, and the like. According to an embodiment, the BPRs 1610 are electrically connected to one or more of the extended source/drain regions 750 through the backside metal contacts 1550 for supplying power to the devices (e.g., field effect transistors) in the FEOL level 30 (FIGS. 12A-12C).

More particularly, in PFET architectures, the BPRs 1610 may include a VDD rail embedded in a PFET region of the semiconductor structure 100, while in NFET architectures, the BPRs 1610 may include a VSS rail embedded in the NFET region of the semiconductor structure 100.

It should be noted that in the semiconductor structure 100, the BILD 1602 in the passive device region 100B is formed at substantially the same level of the BPRs 1610. More particularly, in the proposed embodiments, a top surface of the BILD 1602 in the passive device region 16C is substantially coplanar or flushed with a top surface of the BPRs 1610 formed in the logic device region 100A. Thus, in the depicted embodiment, a top surface of the BILD 1602 in the passive device region 100B is coplanar with a top surface of the BPRs 1610 and a top surface of the BILD 1602 in the logic device region 100A.

Referring now to FIGS. 17A-17B, cross-sectional views of the semiconductor structure 100 are shown after forming a backside power delivery network (PDN) 1740, according to an embodiment of the present disclosure. In this embodiment, FIG. 17A is a cross-sectional view of the logic device region 100A taken along line X-X as depicted in FIG. 1. FIG. 17B is a cross-sectional view of the logic device region 100A taken along line Y-Y as depicted in FIG. 1. FIG. 17C is a cross-sectional view of the passive device region 100B of the semiconductor structure 100.

The structure of the PDN 1740 can be made according to known techniques. Depending on the exact function of the transistor arrangement, a number of the source/drain regions 750 may be connected to backside power and ground via the backside metal contacts 1550.

It should be noted that the BEOL interconnect level 1110 in the semiconductor structure 100 manufactured according to the disclosed technology is separated from the PDN 1740, thereby increasing the routing resources in the semiconductor structure 100 for signal wirings in the BEOL level.

Thus, embodiments of the present invention provide a semiconductor structure including a logic device region having a plurality of field effect transistors, each field effect transistor including a gate structure and a source/drain region disposed on opposing sides of each of the field effect transistors, the source/drain region of at least one field effect transistor extending within a buried dielectric layer for electrically connecting the at least one field effect transistor to a backside power rail, a passive device region including a plurality of passive devices disposed on a first side of a first semiconductor layer and a second semiconductor layer disposed above a second side of the first semiconductor layer opposing the first side of the first semiconductor layer, and a backside interlevel dielectric located above the second semiconductor layer in the passive device region and above the buried dielectric layer in the logic device region, the backside power rail is embedded within the backside interlevel dielectric in the logic device region such that a top surface of the backside interlevel dielectric in the passive device region is coplanar with a top surface of the backside power rail and the backside interlevel dielectric in the logic device region.

According to an embodiment, the semiconductor structure further includes a backside metal contact in direct contact with the source/drain region of the at least one field effect transistor extending within the buried dielectric layer for electrically connecting the at least one field effect transistor to the backside power rail. The first semiconductor layer includes an epitaxially grown silicon layer and the second semiconductor layer includes an epitaxially grown silicon-germanium layer.

According to an embodiment, the semiconductor structure further includes a plurality of metal contacts electrically connecting source/drain regions of field effect transistors not connected to the backside power rail to a first side of a back-end-of-line interconnect level, the plurality of metal contacts connecting the plurality of passive devices to the first side of the back-end-of-line interconnect level.

According to an embodiment, the semiconductor structure further includes a power delivery network electrically connected to the backside power rail in the logic device region, the power delivery network located above the backside interlevel dielectric in the passive device region.

In one or more embodiments, the passive device region includes a plurality of electrical components not requiring backside power supply, including at least one of capacitors and resistors.

According to an embodiment, the semiconductor structure further includes a carrier wafer in contact with a second side of the back-end-of-line interconnect level opposing the first side of the back-end-of-line interconnect level.

In one or more embodiments, an interface between the second semiconductor layer and the backside interlevel dielectric in the passive device region is coplanar with an interface between the backside metal contact and the backside power rail.

In one or more embodiments, a thickness of the first semiconductor layer in the passive device region is equal to a thickness of the buried dielectric layer plus a height of an active channel region in the logic device region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a logic device region including a plurality of field effect transistors, each field effect transistor including a gate structure and a source/drain region disposed on opposing sides of the gate structure, wherein at least one source/drain region of a field effect transistor extends within a buried dielectric layer for electrically connecting the field effect transistor to a backside power rail;
a passive device region including a plurality of passive devices disposed on a first side of a first semiconductor layer and a second semiconductor layer disposed above a second side of the first semiconductor layer opposing the first side of the first semiconductor layer; and
a backside interlevel dielectric located above the second semiconductor layer in the passive device region and above the buried dielectric layer in the logic device region, wherein the backside power rail is embedded within the backside interlevel dielectric in the logic device region, a top surface of the backside interlevel dielectric in the passive device region being coplanar with a top surface of the backside power rail and the backside interlevel dielectric in the logic device region.

2. The semiconductor structure of claim 1, further comprising:
a backside metal contact in direct contact with the at least one source/drain region of the field effect transistor extending within the buried dielectric layer for electrically connecting the field effect transistor to the backside power rail.

3. The semiconductor structure of claim 1, wherein the first semiconductor layer includes an epitaxially grown silicon layer.

4. The semiconductor structure of claim 1, wherein the second semiconductor layer includes an epitaxially grown silicon-germanium layer.

5. The semiconductor structure of claim 1, further comprising:
a plurality of metal contacts electrically connecting source/drain regions of field effect transistors not connected to the backside power rail to a first side of a back-end-of-line interconnect level, the plurality of metal contacts connecting the plurality of passive devices to the first side of the back-end-of-line interconnect level.

6. The semiconductor structure of claim 1, further comprising:
a power delivery network electrically connected to the backside power rail in the logic device region, the power delivery network located above the backside interlevel dielectric in the passive device region.

7. The semiconductor structure of claim 1, wherein the passive device region comprises a plurality of electrical components not requiring backside power supply, including at least one of capacitors and resistors.

8. The semiconductor structure of claim 5, further comprising:
a carrier wafer in contact with a second side of the back-end-of-line interconnect level opposing the first side of the back-end-of-line interconnect level.

9. The semiconductor structure of claim 2, wherein an interface between the second semiconductor layer and the backside interlevel dielectric in the passive device region is coplanar with an interface between the backside metal contact and the backside power rail.

10. The semiconductor structure of claim 1, wherein a thickness of the first semiconductor layer in the passive device region is equal to a thickness of the buried dielectric layer plus a height of an active channel region in the logic device region.

11. A method of forming a semiconductor structure, comprising:
forming a logic device region including a plurality of field effect transistors, each field effect transistor including a gate structure and a source/drain region disposed on opposing sides of the gate structure, wherein at least one source/drain region of a field effect transistor extends within a buried dielectric layer for electrically connecting the field effect transistor to a backside power rail;
forming a passive device region including a plurality of passive devices disposed on a first side of a first semiconductor layer and a second semiconductor layer disposed above a second side of the first semiconductor layer opposing the first side of the first semiconductor layer; and
forming a backside interlevel dielectric above the second semiconductor layer in the passive device region and above the buried dielectric layer in the logic device region, wherein the backside power rail is embedded within the backside interlevel dielectric in the logic device region, a top surface of the backside interlevel dielectric in the passive device region being coplanar with a top surface of the backside power rail and the backside interlevel dielectric in the logic device region.

12. The method of claim 11, further comprising:
forming a backside metal contact in direct contact with the at least one source/drain region of the field effect transistor extending within the buried dielectric layer for electrically connecting the field effect transistor to the backside power rail.

13. The method of claim 11, wherein the first semiconductor layer includes an epitaxially grown silicon layer.

14. The method of claim 11, wherein the second semiconductor layer includes an epitaxially grown silicon-germanium layer.

15. The method of claim 11, further comprising:
forming a plurality of metal contacts for electrically connecting source/drain regions of field effect transistors not connected to the backside power rail to a first side of a back-end-of-line interconnect level, the plurality of metal contacts connecting the plurality of passive devices to the first side of the back-end-of-line interconnect level.

16. The method of claim 11, further comprising:
forming a power delivery network electrically connected to the backside power rail in the logic device region, the power delivery network located above the backside interlevel dielectric in the passive device region.

17. The method of claim 11, wherein the passive device region comprises a plurality of electrical components not requiring backside power supply, including at least one of capacitors and resistors.

18. The method of claim 15, further comprising:
forming a carrier wafer in contact with a second side of the back-end-of-line interconnect level opposing the first side of the back-end-of-line interconnect level.

19. The method of claim 12, wherein an interface between the second semiconductor layer and the backside interlevel dielectric in the passive device region is coplanar with an interface between the backside metal contact and the backside power rail.

20. The method of claim 11, wherein a thickness of the first semiconductor layer in the passive device region is equal to a thickness of the buried dielectric layer plus a height of an active channel region in the logic device region.

* * * * *